United States Patent
Osawa et al.

(10) Patent No.: US 9,304,236 B2
(45) Date of Patent: *Apr. 5, 2016

(54) OPTICAL MEMBER, NEAR INFRARED CUT FILTER, SOLID-STATE IMAGING ELEMENT, LENS FOR IMAGING DEVICE, AND IMAGING/DISPLAY DEVICE USING THE SAME

(75) Inventors: Mitsuo Osawa, Tokyo (JP); Makoto Hasegawa, Tokyo (JP); Wakako Ito, Tokyo (JP); Haisheng Zeng, Tokyo (JP); Keisuke Abe, Tokyo (JP)

(73) Assignee: Asahi Glass Company, Limited, Tokyo (JP)

(*) Notice: Subject to any disclaimer, the term of this patent is extended or adjusted under 35 U.S.C. 154(b) by 974 days.

This patent is subject to a terminal disclaimer.

(21) Appl. No.: 13/490,130
(22) Filed: Jun. 6, 2012

(65) Prior Publication Data

US 2012/0243077 A1 Sep. 27, 2012

Related U.S. Application Data

(63) Continuation of application No. PCT/JP2010/071937, filed on Dec. 7, 2010.

(30) Foreign Application Priority Data

| Dec. 7, 2009 | (JP) | 2009-277242 |
| Dec. 22, 2009 | (JP) | 2009-290392 |
| Jan. 15, 2010 | (JP) | 2010-006893 |
| Feb. 1, 2010 | (JP) | 2010-020235 |

(51) Int. Cl.
| G02B 5/20 | (2006.01) |
| G02B 3/00 | (2006.01) |
| G02B 13/00 | (2006.01) |
| G03B 11/00 | (2006.01) |
| H04N 5/225 | (2006.01) |

(52) U.S. Cl.
CPC .............. *G02B 5/208* (2013.01); *G02B 3/0056* (2013.01); *G02B 5/201* (2013.01); *G02B 13/006* (2013.01); *G03B 11/00* (2013.01); *H04N 5/2254* (2013.01)

(58) Field of Classification Search
CPC .................. G02B 5/003; G02B 5/208; G02B 5/22–5/226; B41M 5/465
USPC ......................... 359/350–361, 614, 885–892; 252/582–589
See application file for complete search history.

(56) References Cited

U.S. PATENT DOCUMENTS

| 7,084,472 B2 | 8/2006 | Fukuyoshi et al. | |
| 8,642,174 B2* | 2/2014 | Ito et al. | 428/402 |
| 2003/0094600 A1* | 5/2003 | Dobler | B82Y 30/00 252/500 |
| 2003/0122114 A1* | 7/2003 | Dobler et al. | 252/587 |
| 2008/0241492 A1* | 10/2008 | Demartin Maeder et al. | 428/211.1 |
| 2008/0308775 A1* | 12/2008 | Yabuki | D01F 1/10 252/587 |
| 2010/0210772 A1* | 8/2010 | Hiwatashi | C09J 133/08 524/407 |
| 2010/0220388 A1* | 9/2010 | Suzuki | B32B 17/10 359/359 |
| 2012/0183763 A1* | 7/2012 | Ito | B82Y 30/00 428/328 |

FOREIGN PATENT DOCUMENTS

| JP | 05-207350 | 8/1993 |
| JP | 06-207161 | 7/1994 |
| JP | 06-306349 | 11/1994 |
| JP | 2002-139605 | 5/2002 |
| JP | 2004-200360 | 7/2004 |
| JP | 2005-345680 | 12/2005 |
| JP | 2006-103069 | 4/2006 |
| JP | 2006-220873 | 8/2006 |
| JP | 2008-181028 | 8/2008 |
| JP | 2008-303130 | 12/2008 |
| WO | WO 2005/030898 | 4/2005 |

OTHER PUBLICATIONS

International Search Report issued Mar. 15, 2011 in PCT/JP2010/071937 filed Dec. 7, 2010.
U.S. Appl. No. 14/166,080, filed Jan. 28, 2014, Osawa, et al.

* cited by examiner

*Primary Examiner* — Bumsuk Won
*Assistant Examiner* — Jeffrey Madonna
(74) *Attorney, Agent, or Firm* — Oblon, McClelland, Maier & Neustadt, L.L.P.

(57) ABSTRACT

Disclosed is an optical member in the form of a film or a thin plate. The optical member contains near infrared absorbing particles comprising crystallites of an oxide containing at least Cu and P and having a number average aggregated particle size of at least 20 nm and at most 200 nm. Further, a near infrared cut filter, a solid-state imaging element, a lens for an imaging device and an imaging/display device are disclosed. They comprise a near infrared absorbing layer containing near infrared absorbing particles comprising crystallites of an oxide containing at least Cu and P and having a number average aggregated particle size of at least 20 nm and at most 200 nm.

28 Claims, 14 Drawing Sheets

OPTICAL MEMBER, NEAR INFRARED CUT FILTER, SOLID-STATE IMAGING ELEMENT, LENS FOR IMAGING DEVICE, AND IMAGING/DISPLAY DEVICE USING THE SAME

TECHNICAL FIELD

The present invention relates to an optical member in the form of a film or a thin plate having a near infrared shielding effect, a near infrared cut filter, a lens for an imaging device and a solid-state imaging element, and further relates to an imaging/display device using the same.

BACKGROUND ART

In recent years, in various applications, an optical filter or film through which light in the visible wavelength region (420 to 630 nm) is transmitted, but which blocks out light in the near infrared wavelength region (700 to 1,200 nm) has been used.

For example, in an imaging device such as a digital still camera or a digital video camera employing a solid-stage imaging element (such as a CCD or a CMOS) or a display device such as an automatic exposure meter employing a light receiving element, in order to bring the sensitivity of the solid-state imaging element or the light receiving element closer to the visual sensitivity of the human, such an optical filter is disposed between an imaging lens and the solid-state imaging element or the light receiving element. Further, in a PDP (plasma display panel), an optical filter is disposed on the front side (the viewer's side) to prevent the malfunction of remote control devices for home electric appliances which are operated by near infrared rays.

As the optical filter or film, a glass filter comprising fluorophosphate glass or phosphate glass which contains CuO or the like, so as to selectively absorb light in the near infrared wavelength region, has been known. Further, a reflection type interference filter comprising, for example, a silicon oxide ($SiO_2$) layer and a titanium oxide ($TiO_2$) layer alternately laminated on a substrate, which reflects and blocks out light in the near infrared wavelength region by interference of light, or a film containing a dye which absorbs light in the near infrared wavelength region incorporated in a transparent resin, has been known (Patent Documents 1 and 2).

However, a light absorbing type glass filter is expensive and is hardly made thin, and it cannot satisfactory meet the demands for downsizing and reduction in thickness of imaging devices in recent years. With a reflection type filter having a light reflecting layer formed thereon, the shielding properties vary depending upon the angle of incidence of light, and the color properties are different between the center portion and the peripheral portion thereof of an image. Further, a ghost is likely to occur by entrance of a reflected light as a stray light into the solid-state imaging element.

A film containing a dye which absorbs light in the near infrared wavelength region incorporated is easily processed and is capable of downsizing and reduction in thickness, and is free from problems as in the reflection type filter, such as the angle of incidence. In addition, the film can be directly bonded to the solid-state imaging element or the like due to its form, and it is advantageous in that further downsizing and reduction in thickness of a device can be achieved. However, this film is not satisfactory in the near infrared shielding properties.

Further, a filter comprising a layer made of a resin which absorbs near infrared rays and a layer which reflects near infrared rays laminated has also been developed (Patent Documents 3 and 4). However, this filter is also not satisfactory in the near infrared shielding properties, and it cannot satisfactory meet the demands for downsizing and reduction in thickness.

On the other hand, it has been proposed to impart a near infrared cut filter function to the solid-state imaging element or the lens itself without using the above-mentioned optical filter or film. For example, a solid-state imaging device comprising a layer containing a compound which has an effect to absorb light having a wavelength in the near infrared region, such as an anthraquinone compound, a lens comprising a dielectric multilayer film having an effect to block out light having a wavelength in the near infrared region on its surface, and a lens formed by using a glass material which selectively absorbs light having a wavelength in the near infrared region, have been developed (Patent Documents 5 to 7).

However, with respect to the solid-state imaging device, the near infrared absorbing compound used has no sufficient effect to absorb light having a wavelength in the near infrared region and in addition, the change in the transmittance in wavelengths from 630 to 700 nm is not steep. Further, there are restrictions on the layer formation such that the function as a solid-state imaging device will not be impaired, it has been difficult to impart a sufficient near infrared cut filter function.

Further, with respect to the lens comprising a dielectric multilayer film, as the dielectric multilayer film has a reflection type interference filter function, that is, it reflects and blocks out light in the near infrared region by interference of light, the shielding properties vary depending upon the angle of incidence of light, and the color properties are different between the center portion and the peripheral portion thereof of the image. Further, a ghost is likely to occur by entrance of a reflected light as a stray light into the solid-state imaging device. With respect to the glass lens, the material itself is expensive and in addition, the production cost is also high since a glass material having a high softening point is press-formed. Further, a near infrared cut filter for an imaging device is required to have an effect to block out light having a wavelength in the near infrared region and to have such a property that the transmittance steeply changes in wavelengths from 630 to 700 nm, to obtain a brighter image of a dark portion. However, the above lenses are not satisfactory in these properties.

PRIOR ART DOCUMENTS

Patent Documents

Patent Document 1: JP-A-2008-181028
Patent Document 2: JP-A-2008-303130
Patent Document 3: JP-A-2005-345680
Patent Document 4: JP-A-2006-220873
Patent Document 5: JP-A-2004-200360
Patent Document 6: JP-A-5-207350
Patent Document 7: JP-A-2002-139605

DISCLOSURE OF INVENTION

Technical Problem

It is an object of the present invention to provide an optical member in the form of a film or a thin plate, which is produced at a low production cost, which is capable of sufficient downsizing and reduction in thickness, which is free from the problems of the angle of incidence as in a reflection type filter, and which is sufficiently excellent also in the near infrared shielding properties, and a near infrared cut filter.

Further, it is an object of the present invention to provide an imaging/display device comprising such an optical member or a near infrared cut filter.

Further, it is an object of the present invention to provide a solid-state imaging element which has both good near infrared shielding function and function as a solid-state imaging element, and which is capable of sufficient downsizing, reduction in thickness and reduction in the cost of a solid state imaging element, and an imaging device comprising it.

Still further, it is an object of the present invention to provide a lens for an imaging device, which has good near infrared shielding properties and which is capable of sufficient downsizing, reduction in thickness and reduction in the cost of an imaging device, and an imaging device comprising it.

Solution to Problem

According to one embodiment of the present invention, an optical member in the form of a film or a thin plate, which contains near infrared absorbing particles comprising crystallites of an oxide containing at least Cu and P and having a number average aggregated particle size of at least 20 nm and at most 200 nm, is provided.

The oxide is preferably a compound represented by the following formula (1) (such as $LiCuPO_4$ or $Mg_{1/2}CuPO_4$):

$$A_{1/n}CuPO_4 \qquad (1)$$

wherein A is at least one member selected from the group consisting of alkaline metals (Li, Na, K, Rb and Cs), alkaline earth metals (Mg, Ca, Sr and Ba) and $NH_4$, and the subscript n is 1 when A is an alkali metal or $NH_4$ and is 2 when A is an alkaline earth metal.

The oxide is preferably a compound represented by the following formula (1) (such as $LiCuPO_4$ or $Mg_{1/2}CuPO_4$):

$$A_{1/n}CuPO_4 \qquad (1)$$

wherein A is one member selected from the group consisting of alkaline metals (Li, Na, K, Rb and Cs), alkaline earth metals (Mg, Ca, Sr and Ba) and $NH_4$, and the subscript n is 1 when A is an alkali metal or $NH_4$ and is 2 when A is an alkaline earth metal.

The size of the crystallites of the near infrared absorbing particles is preferably at least 5 nm and at most 80 nm, as determined by X-ray diffraction.

The near infrared absorbing particles preferably have a change D in the reflectance represented by the following formula (2) of at most −0.41:

$$D(\%/nm)=[R_{700}(\%)-R_{600}(\%)]/[700 \text{ (nm)}-600 \text{ (nm)}] \qquad (2)$$

wherein $R_{700}$ is a reflectance at a wavelength of 700 nm of the near infrared absorbing particles in a diffuse reflectance spectrum, and $R_{600}$ is a reflectance at a wavelength of 600 nm of the near infrared absorbing particles in a diffuse reflectance spectrum.

The near infrared absorbing particles preferably have a reflectance at a wavelength of 715 nm of at most 19% and a reflectance at a wavelength of 500 nm of at least 85% in a diffuse reflectance spectrum.

The near infrared absorbing particles preferably have absorption intensity of a peak in the vicinity of 1,600 $cm^{-1}$ attributable to water of at most 8% and absorption intensity of a peak in the vicinity of 3,750 $cm^{-1}$ attributable to a hydroxy group of at most 26%, based on the absorption intensity (100%) of a peak in the vicinity of 1,000 $cm^{-1}$ attributable to a phosphate group, in the micro-IR spectrum.

The content of the near infrared absorbing particles is preferably at least 20 mass % and at most 60 mass %.

The optical member preferably further contains near infrared absorbing particles without crystallites of an oxide containing at least Cu and P.

The content of the near infrared absorbing particles without crystallites of an oxide containing at least Cu and P is preferably at least 0.5 mass % and at most 30 mass %.

The optical member preferably contains at least ITO particles as the near infrared absorbing particles without crystallites of an oxide containing at least Cu and P.

The optical member preferably contains a transparent resin.

The content of the transparent resin is preferably at least 40 mass % and at most 80 mass %.

The optical member is preferably such that the change D' in the transmittance represented by the following formula (3) is at most −0.36:

$$D'(\%/nm)=[T_{700}(\%)-T_{630}(\%)]/[700 \text{ (nm)}-630 \text{ (nm)}] \qquad (3)$$

wherein $T_{700}$ is a transmittance at a wavelength of 700 nm of the optical member in a transmission spectrum, and $T_{630}$ is a transmittance at a wavelength of 630 nm of the optical member in a transmission spectrum.

According to another embodiment of the present invention, a near infrared cut filter, which comprises a transparent substrate, and a near infrared absorbing layer containing near infrared absorbing particles comprising crystallites of an oxide containing at least Cu and P and having a number average aggregated particle size of at least 20 nm and at most 200 nm, formed on at least one side of the transparent substrate, is provided.

The transparent substrate is preferably made of at least one member selected from the group consisting of glass, polyethylene terephthalate, an acrylic resin, a urethane resin, a polycarbonate resin, polyethylene, an ethylene/vinyl acetate copolymer, a vinyl chloride resin and a fluororesin.

According to another embodiment of the present invention, a solid-state imaging element comprising photoelectric conversion elements, and a near infrared absorbing layer containing near infrared absorbing particles comprising crystallites of an oxide containing at least Cu and P and having a number average aggregated particle size of at least 20 nm and at most 200 nm, formed on the photoelectric conversion elements, is provided.

The solid-state imaging element preferably further has at least one member selected from a light shielding layer, a planarizing layer, a color filter layer and a microlens, on the photoelectric conversion elements.

The solid-state imaging element preferably further has at least one member selected from a light shielding layer, a planarizing layer, a color filter layer and a microlens on the photoelectric conversion elements, at least a part thereof constituted by the above near infrared absorbing layer.

According to another embodiment of the present invention, a lens for an imaging device, which comprises a near infrared absorbing layer containing near infrared absorbing particles comprising crystallites of an oxide containing at least Cu and P and having a number average aggregated particle size of at least 20 nm and at most 200 nm, is provided.

The near infrared absorbing layer is preferably a layer formed on at least one side of the lens main body.

According to another embodiment of the present invention, an imaging device comprising the solid-state imaging element is provided.

According to another embodiment of the present invention, an imaging device comprising the lens for an imaging device is provided.

According to another embodiment of the present invention, an imaging/display device, which comprises a near infrared absorbing layer containing near infrared absorbing particles comprising crystallites of an oxide containing at least Cu and P and having a number average aggregated particle size of at least 20 nm and at most 200 nm, is provided.

Advantageous Effects of Invention

According to the present invention, an optical member, a near infrared cut filter, a solid-state imaging element and a lens, which have good near infrared shielding function and which are capable of sufficient downsizing, reduction in thickness and reduction in the cost of an imaging device and a display device, and an imaging device and a display device employing the same, can be obtained.

DESCRIPTION OF EMBODIMENTS

Now, the embodiments of the present invention will be described in detail below.

First Embodiment

The first embodiment of the present invention relates to an optical member in the form of a film or a thin plate containing near infrared absorbing particles (hereinafter sometimes referred to as nIR absorbing particles).

The nIR absorbing particles used in this embodiment comprise crystallites of an oxide containing at least Cu and P and have a number average aggregated particle size of at least 20 nm and at most 200 nm, and preferably they comprise crystallites of a compound represented by the above formula (1) and have a number average aggregated particle size of at least 20 nm and at most 200 nm. By using the crystallites as an absorbing substance, near infrared absorbing properties resulting from the crystal structure can be maintained. Further, as the crystallites are fine particles, the absorbing substance can be contained in the optical member at a high concentration, and the absorbing ability per unit length can be increased.

Figure 1:
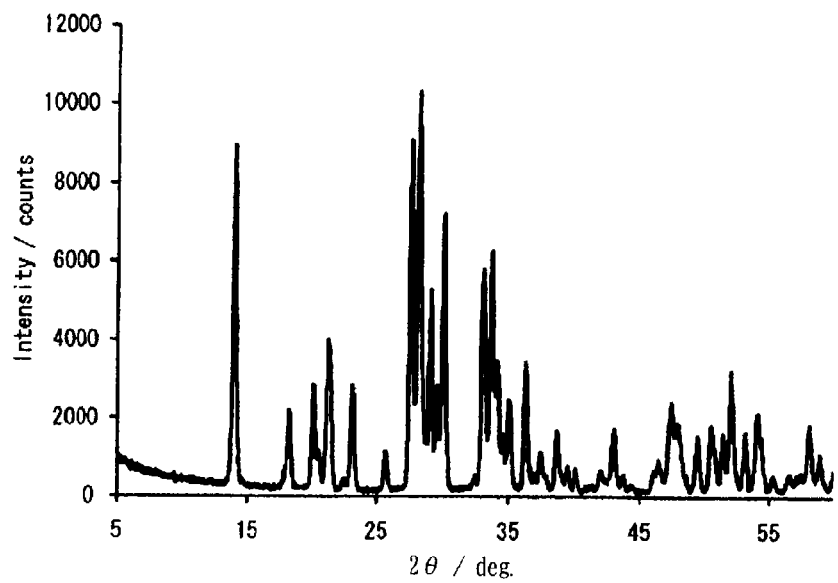
FIG. 1 illustrates one example of an X-ray diffraction pattern of near infrared absorbing particles used in the embodiment of the present invention.

In this specification, the following terms mean as follows. The term "crystallites" means unit crystals which can be considered as single crystals. "The particles" are constituted by a plurality of crystallites. "Comprising crystallites of a compound represented by the formula (1)" means, for example, as shown in FIG. 1, that the crystal structure of $A_{1/n}CuPO_4$ can be confirmed by X-ray diffraction, and particles are confirmed to substantially comprise crystallites of $A_{1/n}CuPO_4$ by X-ray diffraction. "Substantially comprising crystallites of $A_{1/n}CuPO_4$" means that impurities may be contained within a range where the crystallites can sufficiently maintain the crystal structure of $A_{1/n}CuPO_4$ (the crystal structure of $A_{1/n}CuPO_4$ can be confirmed by X-ray diffraction). The X-ray diffraction can be measured by using an X-ray diffraction apparatus with respect to the nIR absorbing particles in a powder state.

The number average aggregated particle size of the nIR absorbing particles is at most 200 nm, preferably at most 100 nm, more preferably at most 70 nm. Further, the number average aggregated particle size of the nIR absorbing particles is at least 20 nm, preferably at least 30 nm, more preferably at least 50 nm. When the number average aggregated particle size is at least 20 nm, excessive pulverization treatment to form fine particles will not be necessary, the crystallites can maintain the crystal structure of $A_{1/n}CuPO_4$, and as a result, the near infrared absorbing properties will be obtained. Further, if the number average aggregated particle size exceeds 200 nm, as the influence of scattering including the Mie scattering tends to be significant, the transmittance of light in the visible wavelength region will be greatly reduced, and the performance such as the contrast or the haze will be deteriorated. When the number average aggregated particle size is at most 100 nm, the influence of scattering tends to be small, and particularly when it is at most 70 nm, the influence of scattered light resulting from the Rayleigh scattering tends to be small, whereby the transparency tends to be high. When the number average aggregated particle size is at least 50 nm and at most 70 nm, the haze tends to be low (that is, the transmittance tends to be high), and the performance of the optical member will be more improved. The number average aggregated particle size is a value measured by using a dynamic light scattering type particle size distribution measuring apparatus with respect to a dispersion for measurement of the particle size having the nIR absorbing particles dispersed in a dispersion medium such as water or an alcohol.

The haze property required for an optical member varies depending upon the use (a device for which it is used), the site of disposition, etc. For example, in the case of an imaging device, the haze is preferably controlled to be at most 1%. If the haze exceeds 1%, the image will be unsharp. The haze is more preferably controlled to be at most 0.2%. For example, in the case of a display device, the haze is preferably controlled to be at most 10%. If the haze exceeds 10%, the contrast of the image tends to be poor. The haze is more preferably controlled to be at most 5%.

The size of the crystallites of the nIR absorbing particles is preferably at least 5 nm and at most 80 nm, more preferably at least 10 nm and at most 80 nm. When the size of the crystallites is at least 5 nm, the crystallites can sufficiently maintain the crystal structure of $A_{1/n}CuPO_4$, and as a result, sufficient near infrared absorbing properties can be obtained. When the size of the crystallites is at most 80 nm, the number average aggregated particle size of the nIR absorbing particles can be suppressed low, and the haze can be suppressed low. The size of the crystallites is a value determined by calculation by Scherrer's method from the X-ray diffraction measurement with respect to the nIR absorbing particles.

The reasons why an alkali metal (Li, Na, K, Rb, Cs), an alkaline earth metal (Mg, Ca, Sr, Ba) or $NH_4$ is employed as A in the compound of the formula (1) are the following (i) to (iii).

(i) The crystal structure of the crystallites of the nIR absorbing particles is a network three-dimensional framework comprising an alternate bond of $PO_4^{3-}$ and $Cu^{2+}$, and has a space in the inside of the framework. The size of the space fits the ion radii of alkali metal ions ($Li^+$: 0.090 nm, $Na^+$: 0.116 nm, $K^+$: 0.152 nm, $Rb^+$: 0.166 nm, $Cs^+$: 0.181 nm), alkaline earth metal ions ($Mg^{2+}$: 0.086 nm, $Ca^{2+}$: 0.114 nm, $Sr^{2+}$: 0.132 nm, $Ba^{2+}$: 0.149 nm) and $NH_4^+$ (0.166 nm), and accordingly the crystal structure can be sufficiently maintained.

(ii) Alkali metal ions, alkaline earth metal ions and $NH_4^+$ can stably be present as monovalent or divalent cations in the solution, and accordingly, in the procedure for production of the nIR absorbing particles, when a precursor of the $A_{1/n}CuPO_4$ compound is formed, the cations are likely to be included in the crystal structure.

(iii) Cations (for example, transition metal ions) which are very likely to be bound to $PO_4^{3-}$ by coordinate bond may provide a crystal structure different from the crystal structure of the present invention which develops sufficient near infrared absorbing properties.

A is particularly preferably K, since the cation size is most suitable as ions included in the framework comprising $PO_4^{3-}$ and $Cu^{2+}$, and such a framework has a thermodynamically stable structure.

The nIR absorbing particles preferably have a change D in the reflectance represented by the following formula (2) of at most −0.41, more preferably at most −0.45.

$$D(\%/nm)=[R_{700}(\%)-R_{600}(\%)]/[700 \text{ (nm)}-600 \text{ (nm)}] \quad (2)$$

wherein $R_{700}$ is a reflectance at a wavelength of 700 nm of the nIR absorbing particles in a diffuse reflectance spectrum, and $R_{600}$ is a reflectance at a wavelength of 600 nm of the nIR absorbing particles in a diffuse reflectance spectrum.

In the diffuse reflectance spectrum with respect to a powder having light absorption, as the intensity of the light absorption varies depending upon the path length at the light absorption wavelength, a weak absorption band in the transmission spectrum is relatively intensely observed. Accordingly, for calculation of the change in the reflectance in this specification, reflectances at 600 nm and 700 nm which are within a range within which the reflectance changes equally to the change in the transmittance in the transmission spectrum are employed.

A high reflectance of the nIR absorbing particles means small absorption of light by the nIR absorbing particles, and a low reflectance of the nIR absorbing particles means large absorption of light by the nIR absorbing particles. That is, the reflectance of the nIR absorbing particles indicates the transmittance of the nIR absorbing particles.

Accordingly, when the change D in the reflectance is at most −0.41, the change in the transmittance in wavelengths from 630 to 700 nm is sufficiently steep, and an optical member containing such particles is suitable, for example, for a near infrared absorbing material of e.g. a camera. When the change is at most −0.45, the light utilization efficiency in the visible wavelength region will further be improved while the light in the near infrared wavelength region is blocked out, such being advantageous in view of suppression of noises in imaging at a dark portion.

Further, the nIR absorbing particles preferably has a reflectance at a wavelength of 715 nm in a diffuse reflectance spectrum of preferably at most 19%, more preferably at most 18%. Further, the nIR absorbing particles has a reflectance at a wavelength of 500 nm in a diffuse reflectance spectrum of preferably at least 85%, more preferably at least 86%. The diffuse reflectance spectrum can be measured by using an ultraviolet visible spectrophotometer with respect to the nIR absorbing particles in a powder state.

The nIR absorbing particles can have sufficient near infrared absorbing properties by the crystallites sufficiently maintaining the crystal structure of $A_{1/n}CuPO_4$. Accordingly, if water or a hydroxy group is attached to the surface of the crystallites, the crystal structure of $A_{1/n}CuPO_4$ will not be maintained, whereby the difference in the transmittance of light between in the visible region and in the near infrared wavelength region will be reduced, and an optical member containing such particles is not suitable, for example, for a near infrared absorbing material of e.g. a camera.

Accordingly, the nIR absorbing particles preferably have absorption intensity of a peak in the vicinity of 1,600 cm$^{-1}$ attributable to water of at most 8% and absorption intensity of a peak in the vicinity of 3,750 cm$^{-1}$ attributable to a hydroxy group of at most 26%, based on absorption intensity (100%) of a peak in the vicinity of 1,000 cm$^{-1}$ attributable to a phosphate group, in the micro-IR spectrum. They more preferably have absorption intensity of a peak in the vicinity of 1,600 cm$^{-1}$ attributable to water of at most 5% and absorption intensity of a peak in the vicinity of 3,750 cm$^{-1}$ attributable to a hydroxy group of at most 15%. The micro-IR spectrum can be measured by a Fourier transform infrared spectrophotometer with respect to the nIR absorbing particles in a powder state. Specifically, it is measured, for example, by micro FT-IR method using a Fourier transform infrared spectrophotometer Magna 760 manufactured by Thermo Fisher Scientific K.K., placing 50 to 100 μg of the nIR absorbing particles on a diamond plate of the spectrophotometer and planarizing the particles by a roller.

Further, with the crystal structure other than $A_{1/n}CuPO_4$, such as $A_{1/n}Cu_4(PO_4)_3$ is increased in the nIR absorbing particles, the change in the transmittance in wavelengths from 630 nm to 700 nm tends to be gradual, and an optical member containing such particles is not suitable, for example, for a near infrared absorbing material of e.g. a camera. Accordingly, it is necessary that the particles are confirmed to substantially comprise crystallites of $A_{1/n}CuPO_4$ by X-ray diffraction.

The nIR absorbing particles used in this embodiment, as described above, comprise crystallites of a compound represented by $A_{1/n}CuPO_4$ and have a number average aggregated particle size of at least 20 nm and at most 200 nm, and accordingly an optical member containing such particles has a high transmittance of light in the visible wavelength region and a low transmittance of light in the near infrared wavelength region, and its transmittance is steeply changed in wavelengths from 630 nm to 700 nm.

The above nIR absorbing particles can be produced, for example, by a process comprising the following steps (a) to (c).

(a) A step of mixing a salt containing Cu$^{2+}$ and a salt or organic substance containing PO$_4^{3-}$ in such a ratio that the molar ratio (PO$_4^{3-}$/Cu$^{2+}$) of PO$_4^{3-}$ to Cu$^{2+}$ will be at least 10 and at most 20, in the presence of A$^{n+}$.

(b) A step of firing the product obtained in the step (a) at a temperature of at least 560° C. and at most 760° C.

(c) A step of crushing the fired product obtained in the step (b) so that the number average aggregated particle size will be at least 20 nm and at most 200 nm.

Now, the respective steps (a) to (c) will be described in detail below.

[Step (a)]

The salt containing Cu$^{2+}$ may, for example, be copper(II) sulfate pentahydrate, copper(II) chloride dihydrate, copper (II) acetate monohydrate, copper(II) bromide or copper(II) nitrate trihydrate.

The salt or organic substance containing PO$_4^{3-}$ may, for example, be a phosphate of an alkali metal, an ammonium salt of phosphoric acid, a phosphate of an alkaline earth metal or phosphoric acid.

The phosphate of an alkali metal or the phosphate of an alkaline earth metal may, for example, be dipotassium hydrogen phosphate, potassium dihydrogen phosphate, potassium phosphate, disodium hydrogen phosphate dodecahydrate, sodium dihydrogen phosphate dihydrate, trisodium phosphate dodecahydrate, lithium phosphate, calcium hydrogen phosphate, magnesium hydrogen phosphate trihydrate or magnesium phosphate octahydrate.

Further, the ammonium salt of phosphoric acid may, for example, be diammonium hydrogen phosphate, ammonium dihydrogen phosphate, sodium ammonium hydrogen phosphate tetrahydrate or ammonium phosphate trihydrate.

In order that A$^{n+}$ be present, a method of using a phosphate of an alkali metal, an ammonium salt of phosphoric acid, a phosphate of an alkaline earth metal or the like as the salt containing PO$_4^{3-}$, or a method of adding a salt containing A$^{n+}$ when the salt containing Cu$^{2+}$ and the salt or organic substance containing PO$_4^{3-}$ are mixed.

The salt containing A$^{n+}$ may, for example, be a hydroxide of an alkali metal, a hydroxide of an alkaline earth metal, a chloride of an alkali metal, a chloride of an alkaline earth metal, a bromide of an alkali metal, a bromide of an alkaline earth metal, a nitrate of an alkali metal, a nitrate of an alkaline earth metal, a carbonate of an alkali metal, a carbonate of an alkaline earth metal, a sulfate of an alkali metal or a sulfate of an alkaline earth metal.

Mixing of the salt containing Cu$^{2+}$ with the salt or organic substance containing PO$_4^{3-}$ is carried out preferably in a solvent in which the salt containing Cu$^{2+}$ and the salt containing PO$_4^{3-}$ and as the case requires, the salt containing A$^{n+}$ can be dissolved. The solvent is preferably water.

The ratio of the salt containing Cu$^{2+}$ and the salt or organic substance containing PO$_4^{3-}$ is such that the molar ratio (PO$_4^{3-}$/Cu$^{2+}$) of PO$_4^{3-}$ to Cu$^{2+}$ is at least 10 and at most 20, preferably at least 12 and at most 18. When PO$_4^{3-}$/Cu$^{2+}$ is at least 10, no $A_{1/n}Cu_4(PO_4)_3$ will be formed as a by-product, or even if it is formed, its amount is such an extent that the crystallites can sufficiently maintain the crystal structure of $A_{1/n}CuPO_4$, and accordingly the change in the transmittance in wavelengths from 630 to 700 nm of an optical member containing the nIR absorbing particles as a product will be sufficiently steep. When PO$_4^{3-}$/Cu$^{2+}$ is at most 20, impurities other than $A_{1/n}CuPO_4$ will not be formed as by-products, or even if such impurities are formed as by-products, their amount is such an extent that the crystallites can sufficiently maintain the crystal structure of $A_{1/n}CuPO_4$, and accordingly, the change in the transmittance in wavelengths from 630 to 700 nm of an optical member containing the nIR absorbing particles as a product will be sufficiently steep.

The temperature when the salt containing Cu$^{2+}$ and the salt or organic substance containing PO$_4^{3-}$ are mixed is preferably at least 10° C. and at most 95° C., more preferably at least 15° C. and at most 40° C. If the temperature is too high, concentration of the solute may occur due to evaporation of the solvent, whereby impurities other than the aimed product may be included. If the temperature is too low, the reaction rate tends to be low, and the reaction time will be long, such being unfavorable in view of the procedure.

The above product is separated e.g. by filtration and as the case requires, washed, dried and wet-pulverized. With a view to suppressing adhesion of the particles by means of water and suppressing growth of particles at the time of firing in the step (b), it is preferred that the product is washed with an organic solvent and moisture contained in the product is removed.

[Step (b)]

The firing temperature is preferably at least 560° C. and at most 760° C., more preferably at least 580° C. and at most 750° C. When the firing temperature is at least 560° C., the crystal structure will be changed due to the structural phase transition, and the crystal structure after the structural phase transition is maintained even after cooled to room temperature. When the firing temperature is at most 760° C., thermolysis will be suppressed. If the firing temperature is too low, the crystal structure will be different from that in the case of firing within the above temperature range, and no sufficient near infrared absorbing properties may be obtained.

At the time of firing, with a view to suppressing growth of the particles, the object to be fired (the product obtained in the step (a)) is preferably permitted to flow. As an apparatus for firing the object to be fired while it is permitted to flow, a rotary kiln may, for example, be mentioned.

[Step (c)]

As a crushing method, a known dry pulverization method or a wet pulverization method may be mentioned, and a wet pulverization is preferred, whereby it tends to be easy to achieve a number average aggregated particle size of at most 200 nm. The dry pulverization method may, for example, be a method using a ball mill, a jet mill, a mill-type pulverizer or a mixer-type pulverizer. The wet pulverization method may, for example, be a method of using a wet mill (such as a ball mill or a planetary mill), a crusher, a mortal, an impact pulverization apparatus (such as a Nanomizer) or a wet atomization apparatus or the like may be mentioned. A method of using a wet atomization apparatus is particularly preferred.

In the case of the wet pulverization method, it is necessary to disperse the fired product obtained in the step (b) in a dispersion medium to form a dispersion for crushing. The dispersion medium may, for example, be water, an alcohol, a ketone, an ether, an ester or an aldehyde. The dispersion medium may be used alone or in combination of two or more. The dispersion medium is preferably water or an alcohol in view of the work environment, and water is particularly preferred in a case where a high pressure is applied to the dispersion for crushing. The amount of the dispersion medium is preferably at least 50 mass % and at most 95 mass %, in the dispersion for crushing (100 mass %), with a view to maintaining dispersibility of the fired product. Water is preferably distilled water, particularly preferably water having an electrical conductivity of at most $1.0 \times 10^4$ S/m. Further, the alcohol is particularly preferably ethanol or isopropyl alcohol.

The crushed product is separated from the dispersion e.g. by centrifugal separation as the case requires, and then washed, dried and dry pulverized. The drying method may, for example, be drying by heating, spray drying, freeze drying or vacuum drying.

The nIR absorbing particles obtained as described above may be surface-treated by a known method, for the purpose of improving the weather resistance, the acid resistance, the water resistance or the like, or improving the compatibility with a binder resin by the surface modification.

The surface treating method may be a method (wet method) of adding a surface treating agent or a surface treating agent diluted with a solvent to dispersion containing the nIR absorbing particles, followed by stirring and treatment, and then removing the solvent for drying, or a method (dry method) of spraying a surface treating agent or a surface treating agent diluted with a solvent by dry air or nitrogen gas while the nIR absorbing particles are stirred, followed by drying. The surface treating agent may, for example, be a surfactant or a coupling agent.

The content of the nIR absorbing particles in the optical member of the present invention is preferably at least 20 mass % and at most 60 mass %, more preferably at least 20 mass % and at most 50 mass %. If the content of the nIR absorbing particles is at least 20 mass %, sufficient near infrared absorbing properties will be obtained. When the content of the nIR absorbing particles is at most 60 mass %, the transmittance of light in the visible wavelength region can be maintained high. The components other than the nIR absorbing particles in the optical member will be described hereinafter and may, for example, be a transparent resin as a matrix material, near infrared absorbing particles other than the nIR absorbing particles comprising crystallites of the $A_{1/n}CuPO_4$ compound, a dye, an ultraviolet absorber, a color calibration dye, a leveling agent, an anti-static agent, a thermal stabilizer, an antioxidant, a dispersing agent, a flame retardant, a lubricant or a plasticizer.

In the optical member, a near infrared or infrared absorbing material other than the nIR absorbing particles comprising crystallites of the $A_{1/n}CuPO_4$ compound may be incorporated. In such a case, the optical member may have a multilayer structure of layers containing the above nIR absorbing particles and/or a near infrared or infrared absorbing material without crystallites of an oxide containing at least Cu and P.

The near infrared or infrared absorbing material other than the nIR absorbing particles may, for example, be inorganic fine particles of e.g. ITO (indium tin oxide), ATO (antimony-doped tin oxide) or lanthanum boride, or an organic dye. Among them, ITO particles are particularly preferred when light shielding property in the infrared wavelength region is required, since they have a high transmittance of light in the visible wavelength region and have light absorptivity in a wide range including the infrared wavelength region exceeding 1,200 nm. The ITO particles are contained preferably in a content of at least 0.5 mass % and at most 30 mass %, more preferably at least 1 mass % and at most 30 mass %, in the optical member. When the content is at least 0.5 mass %, a certain effect with respect to the light shielding property in the infrared wavelength region will be obtained. When the content of the ITO particles is at most 30 mass %, the optical member will not absorb light in the visible wavelength region, whereby transparency can be maintained.

The number average aggregated particle size of the ITO particles is preferably at least 5 nm and at most 200 nm, more preferably at least 5 nm and at most 100 nm, further preferably at least 5 nm and at most 70 nm, with a view to suppressing scattering and maintaining transparency.

The organic dye may, for example, be a cyanine compound, a phthalocyanine compound, a naphthalocyanine compound, a dithiol metal complex compound, a diimmonium compound, a polymethine compound, a phthalide compound, a naphthoquinone compound, an anthraquinone compound or an indophenol compound.

In the optical member, another light absorbing material such as an ultraviolet absorbing material may be incorporated. The ultraviolet absorbing material may, for example, be particles of e.g. zinc oxide, titanium oxide, cerium oxide, zirconium oxide, mica, kaolin or sericite. The number average aggregated particle size of another light absorbing material is preferably at least 5 nm and at most 200 nm, more preferably at least 5 nm and at most 100 nm, further preferably at least 5 nm and at most 70 nm, in view of transparency.

In the optical member, as described above, a matrix material such as a transparent resin may be incorporated. By incorporating a transparent resin, production of the optical member will be easy, and its durability can be improved.

The transparent resin may, for example, be a thermoplastic resin such as a polyester resin, an acrylic resin, a polyolefin resin, a polycarbonate resin, a polyamide resin or an alkyd resin, or a thermosetting resin such as an epoxy resin, a thermosetting acrylic resin or a silsesquioxane resin. In view of the transparency, an acrylic resin or a polyester resin is particularly preferred. Further, the matrix material other than the transparent resin may, for example, be an inorganic material such as silicon oxide, titanium oxide, aluminum oxide or zirconium oxide.

The content of the transparent resin as the matrix material or the like in the optical member is preferably at least 40 mass % and at most 80 mass %, more preferably at least 50 mass % and at most 80 mass %. When the content of the matrix material is at least 40 mass %, sufficient strength will be obtained. If it is at most 80 mass %, sufficient near infrared absorbing properties can be maintained.

The optical member may further contain, in addition to the above components, a color calibration dye, a leveling agent, an anti-static agent, a thermal stabilizer, an antioxidant, a dispersing agent, a flame retardant, a lubricant, a plasticizer or the like within a range not to impair the effects of the present invention.

The optical member of the above embodiment according to the present invention can be produced, for example, as follows.

The nIR absorbing particles and other components blended as the case requires are dispersed or dissolved in a dispersion medium to prepare a coating liquid. This coating liquid is applied to a releasable support in a thin film form and dried, and then the thin film is separated from the releasable support. Application and drying may be carried out dividedly in several times. On that occasion, a plurality of coating liquids differing in the components may be prepared, and they are applied and dried in order. Specifically, in a case of containing the ITO particles, a coating liquid containing the nIR absorbing particles and a coating liquid containing the ITO particles are separately prepared, and they are applied on a releasable support in order and dried, and the obtained coating is separated from the releasable support to produce an optical member.

The dispersion medium may, for example, be water, an alcohol, a ketone, an ether, an ester, an aldehyde, an amine, an aliphatic hydrocarbon, an alicyclic hydrocarbon or an aromatic hydrocarbon. The dispersion medium may be used alone or as a mixture of two or more. The dispersion medium is preferably water or an alcohol in view of the work environment. The amount of the dispersion medium is preferably at least 50 mass % and at most 95 mass % in the dispersion (100 mass %) with a view to maintaining the dispersibility of the nIR absorbing particles.

In the coating liquid, a dispersing agent may be blended as the case requires. The dispersing agent may be one having an effect of modifying the surface of the nIR absorbing particles, for example, a surfactant, a silane coupling agent, a silicone resin, a titanate coupling agent, an aluminum coupling agent or a zircoaluminate coupling agent.

The surfactant may be an anionic surfactant (such as a special polycarboxylic acid polymer surfactant or an alkyl phosphate), a nonionic surfactant (such as polyoxyethylene alkyl ether, polyoxyethylene alkylphenol ether, polyoxyethylene carboxylate or sorbitan higher carboxylate), a cationic surfactant (such as polyoxyethylene alkylamine carboxylate, alkylamine or alkylammonium salt), or an amphoteric surfactant (such as higher alkylbetaine).

The silane compound of the silane coupling agent may, for example, be chlorosilane, alkoxysilane or silazane. The silane coupling agent may, for example, be an alkoxysilane having a functional group (such as a glycidoxy group, a vinyl group, an amino group, an alkenyl group, an epoxy group, a mercapto group, a chloro group, an ammonium group, an acryloxy group or a methacryloxy group).

The silicone resin may, for example, be methyl silicone resin or methyl phenyl silicone resin.

The titanate coupling agent may be one having an acryloxy group, a phosphooxy group, a pyrophosphooxy group, a sulfoxy group, an aryloxy group or the like.

The aluminum coupling agent may be acetoalkoxy aluminum diisopropylate.

The zircoaluminate coupling agent may be one having an amino group, a mercapto group, an alkyl group, an alkenyl group or the like.

The amount of the dispersing agent depends on the type of the dispersing agent and is preferably at least 0.5 mass % and at most 10 mass % in the dispersion (100 mass %). When the amount of the dispersing agent is within such a range, dispersibility of the nIR absorbing particles will be good, and the transparency will not be impaired, and further, the sedimentation of the nIR absorbing particles with time can be suppressed.

For preparation of the coating liquid, a stirring apparatus such as a rotational/orbital-motion mixer, a bead mill, a planetary mill or an ultrasonic homogenizer may be used. In order to secure a high transparency, it is preferred to carry out stirring sufficiently. The stirring may be continuously or intermittently carried out.

For applying the coating liquid, a coating method such as dip coating, spray coating, spinner coating, bead coating, wire bar coating, blade coating, roller coating, curtain coating, slit-die coating, gravure coating, slit reverse coating, microgravure coating, or comma coating may be employed. In addition, bar coating, screen printing, flexographic printing or the like may also be employed.

The releasable support to which the coating liquid is applied may be in the form of a film or a plate, and its material is not particularly limited so long as it is releasable. Specifically, a glass plate, a release-treated plastic film, for example, a film made of e.g. a polyester resin such as polyethylene terephthalate (PET) or polybutylene terephthalate (PBT), a polyolefin resin such as polyethylene, polypropylene or an ethylene/vinyl acetate copolymer, an acrylic resin such as polyacrylate or polymethyl methacrylate, a urethane resin, a vinyl chloride resin, a fluororesin, a polycarbonate resin, a polyvinyl butyral resin or a polyvinyl alcohol resin, or a stainless steel plate may be used.

The optical member of this embodiment when it contains a resin component may be produced by extrusion molding, an in addition, a plurality of film produced by extrusion molding may be laminated and bonded e.g. by thermocompression.

In this embodiment, the thickness of the optical member is not particularly limited and may suitably be determined depending upon the purpose of use, i.e. the disposition space in the device for which it is used, the absorption properties required, etc.

It is preferably within a range of at least 0.03 mm and at most 0.5 mm, more preferably at least 0.09 mm and at most 0.3 mm. When it is at least 0.03 mm, near infrared absorbing ability can sufficiently be obtained, and when it is at least 0.09 mm, flatness of the thickness will easily be obtained, thus reducing the dispersion in the absorptivity. When it is at most 0.5 mm, the flatness of the film thickness is more easily obtained, and when it is at most 0.3 mm, it is advantageous to downsize the device.

The change D' in the transmittance represented by the following formula (3) of the optical member is preferably at most −0.36, more preferably at most −0.45.

$$D'(\%/nm)=[T_{700}(\%)-T_{630}(\%)]/[700 \text{ (nm)}-630 \text{ (nm)}] \quad (3)$$

wherein $T_{700}$ is a transmittance at a wavelength of 700 nm of the optical member in a transmission spectrum, and $T_{630}$ is a transmittance at a wavelength of 630 nm of the optical member in a transmission spectrum.

When the change D' in the transmittance is at most −0.36, the change in the transmittance in wavelengths from 630 to 700 nm will be sufficiently steep, and such an optical member is suitable, for example, for a near infrared absorbing material of e.g. a digital still camera or a digital video camera. When it is at most −0.45, the light utilization efficiency in the visible wavelength region will be more improved while the light in the near infrared wavelength region is blocked out, such being advantageous in suppression of noises in imaging at a dark portion.

The transmittance at a wavelength of 715 nm of the optical member is preferably at most 10%, more preferably at most 5%. The transmittance at a wavelength of 500 nm of the optical member is preferably at least 80%, more preferably at least 85%. The transmittance at a wavelength of 900 nm of the optical member is preferably at most 3%, more preferably at most 2%. The transmittance at a wavelength of 1,100 nm of the optical member is preferably at most 10%, more preferably at most 6%. The transmittance of the optical member can be measured by an ultraviolet visible spectrophotometer.

As the optical member of this embodiment contains nIR absorbing particles comprising crystallites of a compound represented by $A_{1/n}CuPO_4$ and having a number average aggregated particle size of at least 20 nm and at most 200 nm, it has a high transmittance of light in the visible wavelength region. Further, as it contains the nIR absorbing particles having a low reflectance of light in the near infrared wavelength region, the optical member containing such particles has favorable near infrared shielding properties such that the transmittance is steeply changed in wavelengths from 630 nm to 700 nm.

Further, as the near infrared shielding properties utilize absorption of near infrared rays by the nIR absorbing particles, a problem of dependence of the spectral transmittance on the angle of incidence will not arise.

Further, as it is produced by applying a coating liquid prepared by dispersing the nIR absorbing particles and a transparent resin in a dispersion medium to a releasable support, drying the coating liquid, and separating the coating from the releasable support, downsizing and reduction in thickness can be achieved easily and sufficiently.

Further, as it is possible to carry out cutting after film formation on a large area releasable support, it can be produced at a low cost with good productivity.

On one side or both sides of the optical member of this embodiment, a dielectric multilayer film or a moth eye structure may be provided, whereby the interface reflection can be reduced, and the light utilization efficiency can be increased. The dielectric multilayer film is formed by laminating a film made of a transparent material such as a metal oxide such as silicon oxide, titanium oxide, niobium oxide, tantalum oxide or alumina, a metal fluoride such as magnesium fluoride or a fluororesin, to develop an antireflection effect by utilizing interference of light. For its formation, for example, a vacuum film formation process such as a CVD method, a sputtering method or a vacuum deposition method, or a wet film formation process such as a spraying method or a dipping method may be employed. The moth eye structure is a structure having a regular protrusion arrangement with a period smaller than 400 nm for example, and is a structure of suppressing the surface reflectance of light having a wavelength longer than the period, since the effective refractive index continuously changes in the thickness direction, and it can be formed e.g. by molding. The dielectric multilayer film may also function as a filter which controls transmission and reflection of light having a specific wavelength, and it may control the transmission characteristics together with the absorption properties of the infrared absorbing particles.

The optical member of this embodiment may be used as e.g. an optical filter for cutting near infrared rays, for e.g. an imaging device such as a digital still camera or a digital video camera, a monitoring camera, a camera for a vehicle or a web camera, or an automatic exposure meter, or an optical filter for a PDP, by itself or as bonded to the surface of a film-form or plate-form substrate by means of a pressure-sensitive adhesive layer. In the imaging device such as a digital still camera or a digital video camera, a monitoring camera, a camera for a vehicle or a web camera, the optical filter is disposed, for example, between an imaging lens and a solid-state imaging element. The material of the substrate may, for example, be glass, polyethylene terephthalate (PET), an acrylic resin, an urethane resin, polycarbonate, polyethylene, an ethylene/vinyl acetate copolymer, vinyl chloride or a fluororesin.

Further, the optical member of this embodiment may be used as directly bonded, by means of a pressure-sensitive adhesive layer, to e.g. a solid-state imaging element of an imaging device such as a digital still camera or a digital video camera, a monitoring camera, a camera for a vehicle or a web camera, a light receiving element of an automatic exposure meter, an imaging lens or a PDP. Further, it can also be used as directly bonded to a glass window or a lamp of a vehicle (such as an automobile) by means of a pressure-sensitive adhesive layer.

The pressure-sensitive adhesive may, for example, be an acrylate copolymer type, polyvinyl chloride type, epoxy resin type, polyurethane type, vinyl acetate copolymer type, styrene/acrylic copolymer type, polyester type, polyamide type, styrene/butadiene copolymer type, butyl rubber type or silicone resin type pressure-sensitive adhesive. The pressure-sensitive adhesive layer may preliminarily be provided on the optical member. In this case, it is preferred to attach a releasable film of e.g. silicone or PET to the adhesion surface, in view of workability and handling efficiency. To the pressure-sensitive adhesive, additives having various functions such as an ultraviolet absorber may be added.

Second Embodiment

Figure 2:
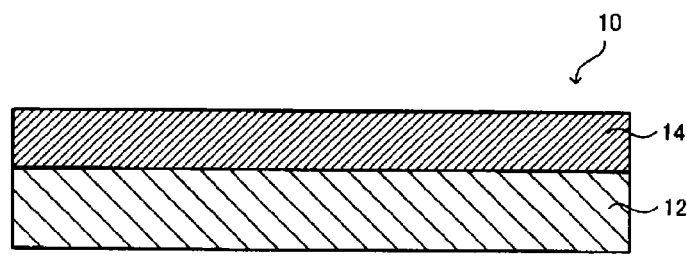
FIG. 2 is a cross-sectional view schematically illustrating a near infrared cut filter according to the embodiment of the present invention.

The second embodiment of the present invention relates to a near infrared cut filter comprising a near infrared absorbing layer containing nIR absorbing particles on a transparent substrate surface. FIG. 2 is a cross-sectional view schematically illustrating a part of the near infrared cut filter according to this second embodiment. In the embodiment described hereinafter, in order to avoid repetition in a description, description of points common to the first embodiment is omitted in some cases, and differences will be mainly described.

As shown in FIG. 2, a near infrared cut filter 10 of this embodiment comprises a transparent substrate 12 and a near infrared absorbing layer 14 containing nIR absorbing particles formed on one side of the transparent substrate. The near infrared absorbing layer 14 may be formed also on the other side of the transparent substrate 12.

Hereinafter, the near infrared absorbing layer containing nIR absorbing particles will sometimes be referred to as a nIR absorbing particle-containing layer.

The shape of the transparent substrate 12 is not particularly limited so long as it transmits light in the visible wavelength region, and the shape may be block, plate or film. The material constituting the transparent substrate 12 may, for example, be crystals of e.g. rock crystal, lithium niobate or sapphire, glass, a polyester resin such as polyethylene terephthalate (PET) or polybutylene terephthalate (PBT), a polyolefin resin such as polyethylene, polypropylene or an ethylene/vinyl acetate copolymer, a norbornene resin, an acrylic resin such as polyacrylate or polymethyl methacrylate, a urethane resin, a vinyl chloride resin, a fluororesin, a polycarbonate resin, a polyvinyl butyral resin or a polyvinyl alcohol resin. Such a material may be one having absorption properties to a wavelength in the ultraviolet region and/or near infrared region. The transparent substrate 12 may, for example, be an infrared absorbing type glass filter comprising fluorophosphate glass, phosphate glass or the like which contains CuO or the like.

The glass as the transparent substrate is made of a transparent material in the visible region and has optionally selected properties such as whether it contains an alkali component or not and the degree of the linear expansion coefficient, considering the device for which the cut filter is used, the site where it is disposed, etc. Particularly, borosilicate glass is preferred, as it is easily processed, and occurrence of scars, foreign substances, etc. on the optical surface can be suppressed, and glass containing no alkali component is more preferred, whereby the adhesion, the weather resistance, etc. will be improved.

Further, crystals of e.g. rock crystal, lithium niobate or sapphire are used as a material of an optical low pass filter or a wave plate to reduce the moire or the false color in an imaging device such as a digital still camera, a digital video camera, a monitoring camera, a camera for a vehicle or a web camera, and when such crystals are used as the material of the transparent substrate 12, a function of the low pass filter or the wave plate can also be imparted to the near infrared cut filter of the present invention, and further downsizing and reduction in thickness of the imaging device can be achieved, such being favorable.

Further, to a solid-state imaging element or a solid-state imaging element package of the above imaging device, a cover to protect the solid-state imaging element is air-tightly sealed. By using this cover as the transparent substrate 12 of the near infrared cut filter of the present invention, a near infrared cut filter which can be used as a cover is obtained, and further downsizing and reduction in thickness of the imaging device can be achieved. The material of the cover may be crystals, glass or a resin, but is preferably crystals or glass from the viewpoint of the heat resistance. In a case where a resin is selected, preferred is a material considering the heat resistance, for example, an acrylic resin, a silicone resin, a fluororesin or an organic/inorganic hybrid material containing e.g. silsesquioxane. If α-ray emitting elements (radioactive isotopes) are contained as impurities in the cover, they emit α-rays and cause transient malfunction (soft error) of the solid-state imaging element. Accordingly, it is preferred to use, for the cover, a material purified to have a high purity with a low α-ray emitting element content as far as possible, and to prevent inclusion of such elements in the production step as far as possible. Among the α-ray emitting elements, the content of U or Th is preferably at most 20 ppb, more preferably at most 5 ppb. Further, a film to block out α-rays may be provided on one side (a side closer to the solid-state imaging element) of the cover, or the near infrared absorbing layer 14 of this embodiment may be made to function as a film which blocks out α-rays.

The glass plate as the transparent substrate may be surface-treated with a silane coupling agent. The adhesion to the near infrared absorbing layer 14 can be increased by using a glass plate surface-treated with a silane coupling agent. The silane coupling agent may, for example, be an aminosilane such as γ-aminopropyltriethoxysilane, N-β-(aminoethyl)-γ-aminopropyltrimethoxysilane, N-β-(aminoethyl)-N'-β-(aminoethyl)-γ-aminopropyltriethoxysilane or γ-anilinopropyltrimethoxysilane, an epoxysilane such as γ-glycidoxypropyltrimethoxysilane or β-(3,4-epoxycyclohexyl)ethyltrimethoxysilane, a vinylsilane such as vinyltrimethoxysilane or N-β-(N-vinylbenzylaminoethyl)-γ-aminopropyltrimethoxysilane, γ-methacryloxypropyltrimethoxysilane, γ-chloropropyltrimethoxysilane or γ-mercaptopropyltrimethoxysilane. The thickness of the glass plate is preferably within a range of at least 0.03 mm and at most 5 mm in view of downsizing and reduction in thickness of the device and with a view to suppressing breakage at the time of handling, and is more preferably within a range of at least 0.05 mm and at most 1 mm in view of weight saving and the strength.

In a case where a film made of a transparent plastic such as polyethylene terephthalate (PET) is used as the transparent substrate 12, its thickness is preferably within a range of at least 10 μm and at most 300 μm. Further, it is preferred to apply corona treatment or adhesion-facilitating treatment to the surface of the film before the near infrared absorbing layer 14 is formed.

In a case where a film made of a transparent plastic is used as the transparent substrate 12, it is possible to bond the other main side of the transparent substrate 12 to a glass plate by means of a pressure-sensitive adhesive or an adhesive. As the glass plate, the same one as exemplified as the material of the transparent substrate 12 may be used, and borosilicate glass is particularly preferred, since it is easily processed, and occurrence of scars, foreign substances, etc. on the optical surface can be suppressed.

As described above, the near infrared cut filter 10 may be used with its transparent substrate 12 side directly bonded to a solid-state imaging element of an imaging device for example. In such a case, the difference between the linear expansion coefficient of the transparent substrate 12 and the linear expansion coefficient at a portion to be bonded is preferably at most $30 \times 10^7$/K with a view to suppressing peeling or the like after bonding. For example, when the material of the portion to be bonded is a silicon, a material having a linear expansion coefficient of about at least $30 \times 10^7$/K and at most $40 \times 10^7$/K, for example, glass of AF33 and TEMPAX (tradenames) manufactured by SCHOTTAG and SW-3, SW-Y, SW-YY, AN100 and EN-A1 (tradenames) manufactured by Asahi Glass Company, Limited and the like is suitable as the material of the transparent substrate 12. When the material of the portion to be bonded is a ceramic such as alumina, a material having a linear expansion coefficient of about at least $50\times10^7$/K and at most $80\times10^7$/K, for example, glass of D263 and B270 manufactured by SCHOTTAG, FP1 and FP01eco manufactured by Asahi Glass Company, Limited, and the like is suitable as the material of the transparent substrate 12.

As the nIR absorbing particles contained in the near infrared absorbing layer 14, the same particles as used in the first embodiment are used. Accordingly, all the descriptions regarding the nIR absorbing particles described in the first embodiment are also applicable to this embodiment.

The content of the nIR absorbing particles in the near infrared absorbing layer 14 is preferably at least 20 mass % and at most 60 mass %, more preferably at least 20 mass % and at most 50 mass %, as described in the first embodiment. When the content of the nIR absorbing particles is at least 20 mass %, sufficient near infrared absorbing properties can be imparted to the near infrared absorbing layer 14. Further, when the content of the nIR absorbing particles is at most 60 mass %, the transmittance of light in the visible wavelength region can be maintained high. The contents other than the nIR absorbing particles in the near infrared absorbing layer will be describe below, and may, for example, be a transparent resin as a matrix material of the layer, a dye, an ultraviolet absorbing material, a color calibration dye, a leveling agent, an anti-static agent, a thermal stabilizer, an antioxidant, a dispersing agent, a flame retardant, a lubricant or a plasticizer.

In the near infrared absorbing layer 14, a near infrared or infrared absorbing material other than the nIR absorbing particles comprising crystallites of the $A_{1/n}CuPO_4$ compound may be incorporated. In such a case, the near infrared absorbing layer 14 may have a multilayer structure of a layer containing the nIR absorbing particles and a layer containing the near infrared or infrared absorbing material other than the nIR absorbing particles, or a multilayer structure of a layer containing the nIR absorbing particles and a layer containing the nIR absorbing particles and the near infrared or infrared absorbing material other than the nIR absorbing particles.

The near infrared or infrared absorbing material other than the nIR absorbing particles may, for example, be inorganic fine particles of e.g. ITO (indium tin oxide), ATO (antimony-doped tin oxide) or lanthanum boride or an organic dye. Among them, ITO particles are particularly preferred when light shielding property in the infrared wavelength region is required, since they have a high transmittance of light in the visible wavelength region and have light absorptivity in a wide range including the infrared wavelength region exceeding 1,200 nm. The ITO particles are contained preferably in a content of at least 0.5 mass % and at most 30 mass %, more preferably at least 1 mass % and at most 30 mass % in the near infrared absorbing layer 14. When the content of the ITO particles is at least 0.5 mass %, a certain effect with respect to light shielding property in the infrared wavelength region will be obtained. Further, when the content of the ITO particles is at most 30 mass %, such a layer will not absorb light in the visible wavelength region, whereby transparency can be maintained.

The number average aggregated particle size of the ITO particles is preferably at least 5 nm and at most 200 nm, more preferably at least 5 nm and at most 100 nm, further preferably at least 5 nm and at most 70 nm, with a view to suppressing scattering and maintaining the transparency.

The organic dye may, for example, be a cyanine compound, a phthalocyanine compound, a naphthalocyanine compound, a dithiol metal complex compound, a diimmonium compound, a polymethine compound, a phthalide compound, a naphthoquinone compound, an anthraquinone compound or an indophenol compound.

Further, in the near infrared absorbing layer 14, another light absorbing material such as an ultraviolet absorbing material may be incorporated. The ultraviolet absorbing material may, for example, be particles of e.g. zinc oxide, titanium oxide, cerium oxide, zirconium oxide, mica, kaolin or sericite. The number average aggregated particle size of such another light absorbing material is preferably at least 5 nm and at most 200 nm, more preferably at least 5 nm and at most 100 nm, further preferably at least 5 nm and at most 70 nm, in view of transparency.

In the near infrared absorbing layer 14, as described above, a transparent resin may be incorporated. By incorporating a transparent resin, layer formation of the near infrared absorbing layer 14 will be easy, and durability of the near infrared absorbing layer 14 and thus the near infrared cut filter can be increased.

The transparent resin may, for example, be a thermoplastic resin such as a polyester resin, an acrylic resin, a polyolefin resin, a polycarbonate resin, a polyamide resin or an alkyd resin, or a thermosetting resin such as an epoxy resin, a thermosetting acrylic resin or a silsesquioxane resin. In view of the transparency, an acrylic resin or a polyester resin is particularly preferred. The content of the transparent resin in the near infrared absorbing layer 14 is preferably at least 40 mass % and at most 80 mass %, more preferably at least 50 mass % and at most 80 mass %. When the content of the transparent resin is at least 40 mass %, sufficient effects by its use will be obtained, and when it is at most 80 mass %, sufficient near infrared absorbing properties can be maintained.

In the near infrared absorbing layer 14, in addition to the above components, a color calibration dye, a leveling agent, an anti-static agent, a thermal stabilizer, an antioxidant, a dispersing agent, a flame retardant, a lubricant, a plasticizer or the like may further be incorporated within a range not to impair the effects of the present invention.

The near infrared absorbing layer 14 can be formed by dispersing or dissolving the above nIR absorbing particles and other components blended as the case requires in a dispersion medium to prepare a coating liquid, and applying and drying the coating liquid on the transparent substrate 12. Application and drying may be carried out dividedly in several times. On that occasion, a plurality of coating liquids differing in the components may be prepared, and they are applied and dried in order. Specifically, for example, in the case of containing the ITO particles, a coating liquid containing the nIR absorbing particles and a coating liquid containing the ITO particles are separately prepared, and they are applied and dried on the transparent substrate 12 in order to form the near infrared absorbing layer 14.

The dispersion medium, the coating liquid, the surfactant, the silane coupling agent, the silicone resin, the titanate coupling agent, the aluminum coupling agent, the zircoaluminate coupling agent, the amount of the dispersing agent, the method for preparing the coating liquid, and the method of applying the coating liquid may be the same as employed in the first embodiment. Accordingly, all the descriptions in the first embodiment are also applicable to this embodiment.

The thickness of the near infrared absorbing layer 14 is preferably within a range of at least 1 μm and at most 200 μm, more preferably within a range of at least 4 μm and at most 100 μm, further preferably within a range of at least 20 μm and at most 50 μm. When it is at least 1 μm, sufficient near infrared absorbing ability can be obtained, and when it is at most 200 μm, remaining of the dispersion medium at the time of the layer formation can be suppressed. When it is at least 4 μm, the flatness of the film thickness is more likely to be obtained, and dispersion of the absorptivity can be reduced. When it is at most 100 µm, flatness of the film thickness is more likely to be obtained and in addition, such is advantageous for reduction in thickness.

The near infrared absorbing layer 14 has a change D' in the transmittance represented by the following formula (3) of preferably at most −0.36, more preferably at most −0.45.

$$D'(\%/nm) = [T_{700}(\%) - T_{630}(\%)]/[700 \text{ (nm)} - 630 \text{ (nm)}] \quad (3)$$

wherein $T_{700}$ is a transmittance at a wavelength of 700 nm of the near infrared absorbing layer in a transmission spectrum, and $T_{630}$ is a transmittance at a wavelength of 630 nm of the near infrared absorbing layer in a transmission spectrum.

When the change D' in the transmittance is at most −0.36, the change in the transmittance in wavelengths from 630 to 700 nm will be sufficiently steep, and such a layer is suitable, for example, for a near infrared absorbing filter of e.g. a digital still camera or a digital video camera. When it is at most −0.45, the light utilization efficiency in the visible wavelength region will further be improved while light in the near infrared wavelength region is blocked out, such being advantageous in suppression of noises in imaging at a dark portion.

The transmittance at a wavelength of 715 nm of the near infrared absorbing layer 14 is preferably at most 10%, more preferably at most 5%. The transmittance at a wavelength of 500 nm of the near infrared absorbing layer 14 is preferably at least 80%, more preferably at least 85%. The transmittance of the near infrared absorbing coating film can be measured by an ultraviolet visible spectrophotometer.

As the near infrared cut filter 10 according to this embodiment has, on one main surface of the transparent substrate 12, a near infrared absorbing layer containing nIR absorbing particles comprising crystallites of a compound represented by $A_{1/n}CuPO_4$ and having a number average aggregated particle size of at least 20 nm and at most 200 nm, it has a high transmittance of light in the visible wavelength region. Further, as it contains nIR absorbing particles having a low transmittance of light in the near infrared wavelength region, the transmittance of the near infrared absorbing layer 14 containing the particles steeply changes in wavelengths from 630 to 700 nm, and the near infrared cut filter 10 has good infrared shielding properties.

Further, as the near infrared absorbing layer 14 is formed by applying and drying a coating liquid prepared by dispersing the nIR absorbing particles in a dispersion medium on one main surface of the transparent substrate 12, downsizing and reduction in thickness can be achieved easily and sufficiently.

Further, as cutting is possible after formation of the near infrared absorbing layer 14 on one main surface of the large area transparent substrate 12, the near infrared cut filter can be provided at a low cost with excellent productivity.

In this embodiment, the cut filter 10 may have a structure such that another transparent substrate is bonded to the other side of the near infrared absorbing layer 14 from the transparent substrate 12 side to sandwich the near infrared absorbing layer 14, whereby the weather resistance can be improved. The transparent substrate may be the same one as the above-described transparent substrate 12.

Further, in this embodiment, a dielectric multilayer film or a moth eye structure may be provided on the surface on the near infrared absorbing layer 14 side and/or the transparent resin 12 side, whereby the interface reflection can be reduced, and the light utilization efficiency can be increased. The dielectric multilayer film is formed by laminating a film made of a transparent material such as a metal oxide such as silicon oxide, titanium oxide, niobium oxide, tantalum oxide or alumina, a metal fluoride such as magnesium fluoride or a fluororesin, to develop an antireflection effect by utilizing interference of light. For formation of such a film, for example, a vacuum film formation process such as a CVD method, a sputtering method or a vacuum deposition method, or a wet film formation process such as a spraying method or a dipping method may be employed. The moth eye structure is a structure having a regular protrusion arrangement with a period smaller than 400 nm for example, and is a structure of suppressing the surface reflectance of light having a wavelength longer than the period, since the effective refractive index continuously changes in the thickness direction, and it can be formed e.g. by molding.

The near infrared cut filter of this embodiment can be used, for example, as a near infrared cut filter for e.g. an imaging device such as a digital still camera or a digital video camera, a monitoring camera, a camera for a vehicle or a web camera, or an automatic exposure meter, or an optical filter for a PDP. Further, it can also be used as a glass window for a vehicle. In an imaging device such as a digital still camera or a digital video camera, a monitoring camera, a camera for a vehicle or a web camera, the near infrared cut filter is disposed, for example, between an imaging lens and a solid-state imaging element. In an automatic exposure meter, it is disposed, for example, in front of a light receiving element. In a PDP, it is disposed in front of (on the viewer's side) of the PDP.

In an imaging device, the near infrared cut filter may be disposed at a position distant from the front of the solid-state imaging element or may directly be bonded to the solid-state imaging element or a package of the solid-state imaging element. Further, it may also be directly bonded to an optical low pass filter using crystals of rock crystal, lithium niobate or the like, to reduce the moire or the false color. With respect to other devices, it may be disposed at a position apart from the front (on the viewer's side) of the light receiving element or PDP, or it may directly be bonded thereto.

Third Embodiment

Figure 3:
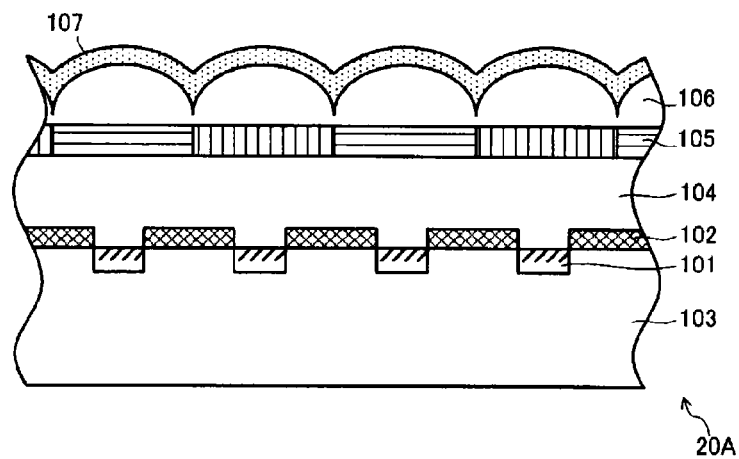
FIG. 3 is a cross-sectional view illustrating a solid-state imaging element according to the embodiment of the present invention.

The third embodiment of the present invention relates to a solid-state imaging element comprising a near infrared absorbing layer containing near infrared absorbing particles. FIG. 3 is a cross-sectional view schematically illustrating a part of a solid-state imaging element according to this third embodiment. The solid-state imaging element of this embodiment is a solid-state imaging element to be used for an imaging device such as a miniature camera, to be installed in information equipment of e.g. a digital still camera, a digital video camera, a portable phone, a notebook personal computer or a PDA (personal digital assistant).

As shown in FIG. 3, in a solid-state imaging element 20A, on a semiconductor substrate 103 such as a silicon substrate having photoelectric conversion elements 101 and a light shielding layer 102 formed thereon, a planarizing layer 104, a color filter layer 105 and a microlens 106 are provided in this order. On the surface of the microlens 106, a layer (near infrared absorbing layer) 107 containing nIR absorbing particles as described hereinafter is provided.

A plurality of photoelectric conversion elements 101 are formed on the surface layer of the semiconductor substrate 103, and the light shielding layer 102 is formed at a portion excluding the photoelectric conversion elements 101. Light which entered the photoelectric conversion elements 101 undergoes photoelectric conversion by a photodiode. The planarizing layer 104 is formed on the photoelectric conversion elements 101 and the light shielding layer 102 and planarizes the entire surface.

The color filter layer 105 is formed corresponding to the photoelectric conversion elements 101, and in the case of the primary colors, it comprises color filters of red (R), green (G) and blue (B), and in the case of the complimentary colors (YMC), it comprises color filters of yellow (Y), magenta (Mg) and cyan (Cy). The number of colors of the color filters is not limited, and in order to further increase the color reproducibility, in the above primary colors for example, a yellow color filter or the like may be added so that three or more colors are employed. Further, disposition of the respective colors is not particularly limited. Further, in this embodiment, the color filter layer 105 is provided over the entire surface, but it may not be provided on a part, or the imaging element may have a structure without the color filter layer 105. The color filter is formed from a resin containing a pigment or a dye for example.

The microlens 106 is formed by e.g. a heat molding method or an etching method from a resin such as a polystyrene resin, an acrylic resin, a polyolefin resin, a polyimide resin, a polyamide resin, a polyester resin, a polyethylene resin or a novolac resin. The microlens 106 may be formed by glass, crystals or the like in addition to a resin. Light which passed through the microlens 106 is focused on the photoelectric conversion elements 101.

Now, the near infrared absorbing layer 107 formed on the surface of the microlens 106 will be described.

As the nIR absorbing particles contained in the near infrared absorbing layer 107, the same particles as used in the above-described first embodiment are used. Accordingly, all the descriptions regarding the nIR absorbing particles described in the first embodiment are also applicable to this embodiment.

The content of the nIR absorbing particles in the near infrared absorbing layer 107 is preferably at least 20 mass % and at most 60 mass %, more preferably at least 20 mass % and at most 50 mass %, as described in the second embodiment. When the content of the nIR absorbing particles is at least 20 mass %, sufficient near infrared absorbing properties can be imparted to the near infrared absorbing layer 14. When the content of the nIR absorbing particles is at most 60 mass %, the transmittance of light in the visible wavelength region can be maintained high. The contents other than the nIR absorbing particles in the near infrared absorbing layer will be describe below, and may, for example, be a transparent resin as a matrix material of the layer, a dye, an ultraviolet absorbing material, a color calibration dye, a leveling agent, an anti-static agent, a thermal stabilizer, an antioxidant, a dispersing agent, a flame retardant, a lubricant or a plasticizer.

In the near infrared absorbing layer 107, a near infrared or infrared absorbing material other than the nIR absorbing particles comprising crystallites of the $A_{1/n}CuPO_4$ compound may be incorporated. In such a case, the near infrared absorbing layer 107 may have a multilayer structure of a layer containing the nIR absorbing particles and a layer containing the near infrared or infrared absorbing material other than the nIR absorbing particles or a layer containing the nIR absorbing particles and the near infrared or infrared absorbing material other than the nIR absorbing particles.

The near infrared or infrared absorbing material other than the nIR absorbing particles comprising crystallites of the $A_{1/n}CuPO_4$ compound may be a near infrared absorbing material without crystallites of an oxide containing at least CU and P, such as inorganic fine particles of e.g. ITO (indium tin oxide), ATO (antimony-doped tin oxide) or lanthanum boride or an organic dye. Among them, ITO particles are particularly preferred when light shielding property in the infrared wavelength region is required, since they have a high transmittance of light in the visible wavelength region and have light absorptivity in a wide range including the infrared wavelength region exceeding 1,200 nm. The ITO particles are contained preferably in a content of at least 0.5 mass % and at most 30 mass %, more preferably at least 1 mass % and at most 30 mass % in the near infrared absorbing layer 107. When the content of the ITO particles is at least 0.5 mass %, a certain effect with respect to light shielding properties in the infrared wavelength region will be obtained. When the content of the ITO particles is at most 30 mass %, such a layer will not absorb light in the visible wavelength region, whereby transparency can be maintained.

The number average aggregated particle size of the ITO particles is preferably at least 5 nm and at most 200 nm, more preferably at least 5 nm and at most 100 nm, further preferably at least 5 nm and at most 70 nm, with a view to suppressing scattering and maintaining the transparency.

The organic dye may, for example, be a cyanine compound, a phthalocyanine compound, a naphthalocyanine compound, a dithiol metal complex compound, a diimmonium compound, a polymethine compound, a phthalide compound, a naphthoquinone compound, an anthraquinone compound or an indophenol compound.

Further, in the near infrared absorbing layer 107, another light absorbing material such as an ultraviolet absorbing material may be incorporated. The ultraviolet absorbing material may, for example, be particles of e.g. zinc oxide, titanium oxide, cerium oxide, zirconium oxide, mica, kaolin or sericite. The number average aggregated particle size of such another light absorbing material is preferably at least 5 nm and at most 200 nm, more preferably at least 5 nm and at most 100 nm, further preferably at least 5 nm and at most 70 nm, in view of transparency.

In the near infrared absorbing layer 107, as described above, a transparent resin may be incorporated. By incorporating a transparent resin, layer formation of the near infrared absorbing layer 107 will be easy, and durability of the near infrared absorbing layer 107 and thus the solid-state imaging element 20A can be increased.

The transparent resin may, for example, be a thermoplastic resin such as a polyester resin, an acrylic resin, a polyolefin resin, a polycarbonate resin, a polyamide resin or an alkyd resin, or a thermosetting resin such as an epoxy resin, a thermosetting acrylic resin or a silsesquioxane resin. In view of the transparency, an acrylic resin or a polyester resin is particularly preferred. The content of the transparent resin in the near infrared absorbing layer 107 is preferably at least 40 mass % and at most 80 mass %, more preferably at least 50 mass % and at most 80 mass %. When the content of the transparent resin is at least 40 mass %, sufficient effects by its use will be obtained, and when it is at most 80 mass %, sufficient near infrared absorbing properties can be maintained.

In the near infrared absorbing layer 107, in addition to the above components, a color calibration dye, a leveling agent, an anti-static agent, a thermal stabilizer, an antioxidant, a dispersing agent, a flame retardant, a lubricant, a plasticizer or the like may further be incorporated within a range not to impair the effects of the present invention.

The near infrared absorbing layer 107 can be formed by dispersing or dissolving the above nIR absorbing particles and other components blended as the case requires in a dispersion medium to prepare a coating liquid, and applying and drying the coating liquid on the microlens 106. Application and drying may be carried out dividedly in several times. On that occasion, a plurality of coating liquids differing in the components may be prepared, and they are applied and dried in order. Specifically, for example, in the case of containing the ITO particles, a coating liquid containing the nIR absorbing particles and a coating liquid containing the ITO particles are separately prepared, and they are applied and dried on the microlens 106 in order to form the near infrared absorbing layer 107.

The dispersion medium, the coating liquid, the surfactant, the silane coupling agent, the silicone resin, the titanate coupling agent, the aluminum coupling agent, the zircoaluminate coupling agent, the amount of the dispersing agent, the method for preparing the coating liquid, and the method of applying the coating liquid may be the same as employed in the first embodiment. Accordingly, all the descriptions in the first embodiment are also applicable to this embodiment.

The thickness of the near infrared absorbing layer 107 is preferably within a range of at least 1 μm and at most 200 μm, more preferably within a range of at least 4 μm and at most 100 μm, further preferably within a range of at least 20 μm and at most 50 μm. When it is at least 1 μm, sufficient near infrared absorbing ability can be obtained, and when it is at most 200 μm, remaining of the dispersion medium at the time of the layer formation can be suppressed. When it is at least 4 μm, the flatness of the film thickness is more likely to be obtained, and dispersion of the absorptivity can be reduced. When it is at most 100 μm, flatness of the film thickness is likely to be obtained and in addition, such is advantageous for reduction in thickness.

The near infrared absorbing layer 107 has a change D' in the transmittance represented by the following formula (3) of preferably at most −0.36, more preferably at most −0.45.

$$D'(\%/nm)=[T_{730}(\%)-T_{630}(\%)]/[700\ (nm)-630\ (nm)] \quad (3)$$

wherein $T_{700}$ is a transmittance at a wavelength of 700 nm of the near infrared absorbing layer in a transmission spectrum, and $T_{630}$ is a transmittance at a wavelength of 630 nm of the near infrared absorbing layer in a transmission spectrum.

When the change D' in the transmittance is at most −0.36, the change in the transmittance in wavelengths from 630 to 700 nm will be sufficiently steep, and such a layer is suitable for a solid-state imaging element. When it is at most −0.45, the light utilization efficiency in the visible wavelength region will further be improved while light in the near infrared wavelength region is blocked out, such being advantageous in suppression of noises in imaging at a dark portion.

Further, the transmittance at a wavelength of 715 nm of the near infrared absorbing layer 107 is preferably at most 10%, more preferably at most 5%. The transmittance at a wavelength of 500 nm of the near infrared absorbing layer 107 is preferably at least 80%, more preferably at least 85%. The transmittance of the near infrared absorbing layer can be measured by an ultraviolet visible spectrophotometer.

The solid-state imaging element 20A according to this embodiment comprises the near infrared absorbing layer 107 specific to the present invention on the surface of the microlens 106 and accordingly, a near infrared cut filter which has been disposed separately can be omitted, and downsizing, reduction in thickness and reduction in the cost of an imaging device can be achieved.

As the near infrared absorbing layer 107 contains near infrared absorbing particles comprising crystallites of a compound represented by $A_{1/n}CuPO_4$ and having a number average aggregated particle size of at least 20 nm and at most 200 nm, it has a high transmittance of light in the visible wavelength region. Further, as it contains nIR absorbing particles having a low transmittance of light in the near infrared wavelength region, the transmittance of the near infrared absorbing layer 107 containing the particles steeply changes in wavelengths from 630 to 700 nm, and the solid-state imaging element 20A according to this embodiment has good infrared shielding properties.

Further, as the near infrared absorbing layer 107 is formed by applying and drying a coating liquid prepared by dispersing the nIR absorbing particles in a dispersion medium on the surface of the microlens 106, the function as a solid-state imaging element will not be deteriorated.

Accordingly, the solid-state imaging element 20A of this embodiment has both good near infrared cut filter function and function as a solid-state imaging element, and by using such an element, an imaging device which is small in size and thick, available at a low cost, and providing excellent quality of images, can be obtained.

Figure 4:
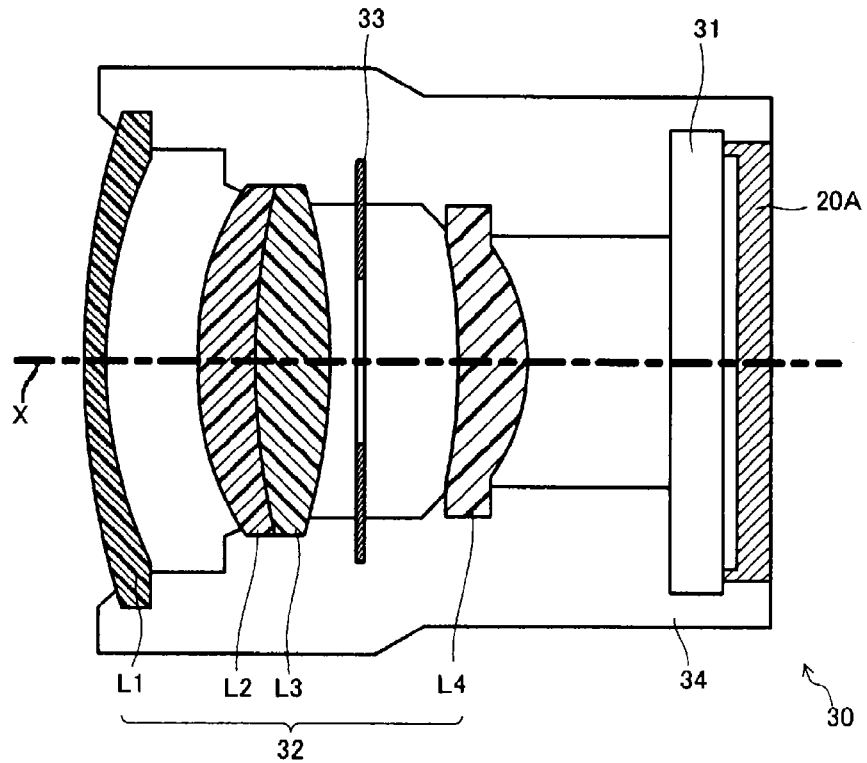
FIG. 4 is a cross-sectional view illustrating one example of an imaging device employing a solid-state imaging element according to the embodiment of the present invention.

FIG. 4 is a cross-sectional view schematically illustrating a substantial part of one example of an imaging device using the above solid-state imaging element 20A. This imaging device 30 comprises, as shown in FIG. 4, a solid-state imaging element 20A, a cover glass 31 and a group 32 of a plurality of lenses, a diaphragm 33 and a chassis 34 to fix them. The group 32 of a plurality of lenses comprises a first lens L1, a second lens L2, a third lens L3 and a fourth lens L4 disposed to face the imaging surface of the solid-state imaging element 20A. The diaphragm 33 is disposed between the fourth lens L4 and the third lens L3. The solid-state imaging element 20A, the lens group 32 and the diaphragm 33 are disposed along an axis x.

In the imaging device 30, light which entered from the subject side passes through the first lens L1, the second lens L2, the third lens L3, the diaphragm 33, the fourth lens L4 and the cover glass 31 and is received by the solid-state imaging element 20A. The received light is converted to electrical signals by the solid-state imaging element 20A, and is output as image signals. The solid-state imaging element 20A is provided with a near infrared absorbing layer 107, and light with near infrared rays blocked out is received by the solid-state imaging element 20A.

As described above, the solid-state imaging element 20A has both good near infrared cut filter function and function as a solid-state imaging element, and accordingly downsizing, reduction in thickness and reduction in the cost of the imaging device can be achieved, and an image with good quality can be obtained.

The solid-state imaging element 20A is provided with one layer of the near infrared absorbing layer 107 on the surface (i.e. the upper side) of the microlens 106. However, the near infrared absorbing layer 107 may be provided below the microlens 106, or may be provided on or below the color filter layer 105, the planarizing layer 104 or the light shielding layer 102, or may be provided on two or more portions thereof.

Figure 5:
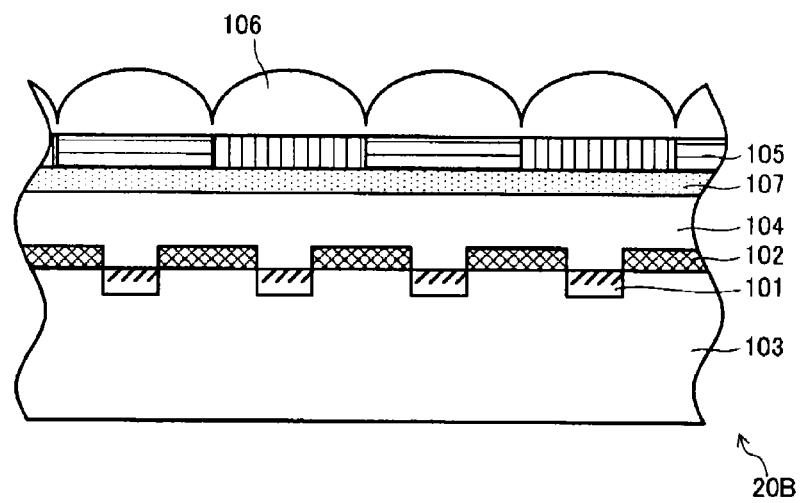
FIG. 5 is a cross-sectional view illustrating a modified example of a solid-state imaging element according to the embodiment of the present invention.
Figure 6:
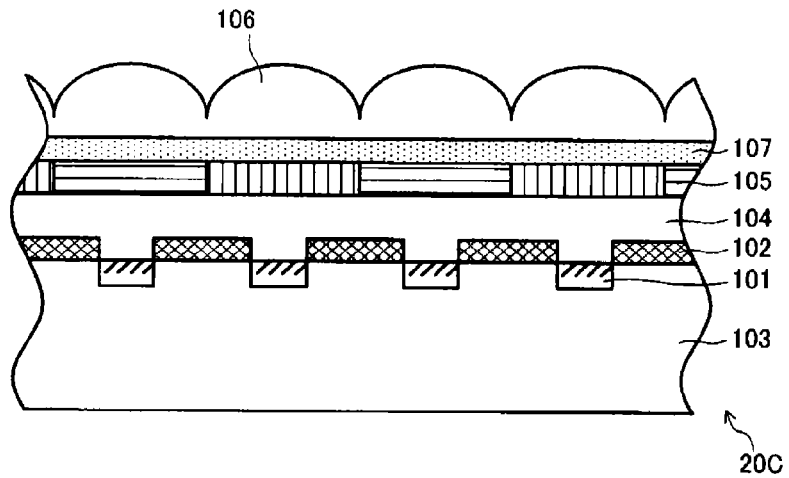
FIG. 6 is a cross-sectional view illustrating a modified example of a solid-state imaging element according to the embodiment of the present invention.

FIGS. 5 and 6 illustrate such examples. In a solid-state imaging element 20B shown in FIG. 5, the near infrared absorbing layer 107 is provided between the planarizing layer 104 and the color filter layer 105. Further, in a solid-state imaging element 20C shown in FIG. 6, the near infrared absorbing layer 107 is provided below the microlens 106.

With respect to such solid-state imaging elements 20B and 20C having these structures, the same effects as the solid-state imaging element 20A shown in FIG. 3 can be obtained and in addition, formation of the near infrared absorbing layer 107 is easy as compared with the solid-state imaging element 20A, since it is formed on a flat plane as compared with the microlens 106 surface.

Further, although not shown, by incorporating the above-described nIR absorbing particles in a part or the whole of each of optical components constituting the solid-state imaging element (for example, in the solid-state imaging elements 20A to 20C, the microlens 106, the color filter layer 105, the planarizing layer 104 and the light shielding layer 102), whereby the optical components can also have a function as a near infrared absorbing layer. That is, when such optical components are formed, a part or the whole of each component can be formed by a material having the above-described nIR absorbing particles and other components blended as the case requires added. Specifically, for example, in the case of a solid-state imaging element comprising a microlens, a color filter layer, a planarizing layer and a light shielding layer as optical components, such as the solid-state imaging elements 20A to 20C, the above-described nIR absorbing particles are incorporated in a part or the whole of at least one optical component among the microlens, the color filter layer, the planarizing layer and the light shielding layer, whereby such an optical component can also have a function as a near infrared absorbing layer. In such a case, downsizing and reduction in thickness can further be achieved as compared with the solid-state imaging elements 20A to 20C comprising a near infrared absorbing layer separately from the optical components. Thus, further downsizing and reduction in thickness of an imaging device can be achieved. In the case of a solid-state imaging element comprising a microlens, a color filter layer, a planarizing layer and a light shielding layer as optical components, it is preferred to incorporate the nIR absorbing particles in at least one of the color filter layer and the planarizing layer, in view of easiness of formation and the near infrared absorbing effects.

Further, in the solid-state imaging element, not only the near infrared absorbing layer but also an ultraviolet absorbing layer which absorbs ultraviolet rays may be provided, for example, between the planarizing layer 104 and the color filter layer 105. Further, an antireflection layer may be formed on the microlens 106 or on the near infrared absorbing layer 107 provided on the surface of the microlens 106. By forming an antireflection layer, re-reflection of the incident light can be prevented, and the quality of an image can be improved.

Further, the imaging device for which the solid-state imaging element of this embodiment is used is not limited to one having a structure shown in FIG. 4, and the solid-state imaging element can be applicable to imaging devices having various structures so long as they have the solid-state imaging element.

Fourth Embodiment

The fourth embodiment of the present invention relates to a lens for an imaging device, comprising a near infrared absorbing layer containing near infrared absorbing particles.

Figure 7:
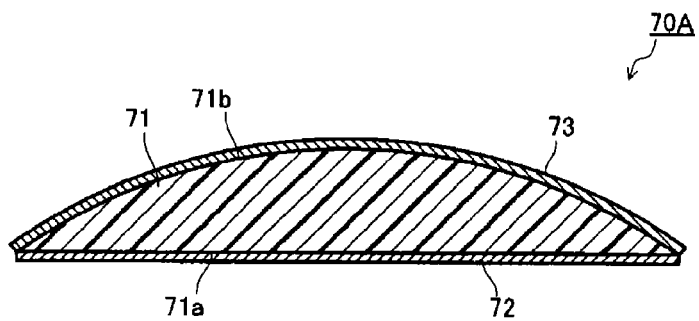
FIG. 7 is a cross-sectional view illustrating one example of a lens for an imaging device according to the embodiment of the present invention.

FIG. 7 is a cross-sectional view illustrating a lens for an imaging device according to this fourth embodiment. This lens for an imaging device is a lens constituting the whole or a part of the lens system for image formation on a solid-state imaging element of an imaging device such as a miniature camera installed in information equipment of e.g. a digital still camera, a digital video camera, a portable phone, a notebook personal computer or a PDA.

As shown in FIG. 7, the lens 70A for an imaging device has a lens main body 71 comprising a so-called glass plano-convex lens, one surface (refracting surface) 71*a* of which is planar and the other surface (refracting surface) 71*b* of which is convex, a layer (near infrared absorbing layer) 72 containing nIR absorbing particles provided on one surface 71*a* and an antireflection film 73 provided on the other surface 71*b*.

The shape, the material and the like of the lens to be used for the lens main body 71 are not particularly limited so long as the lens is one which has been used in such an application.

Figure 8:
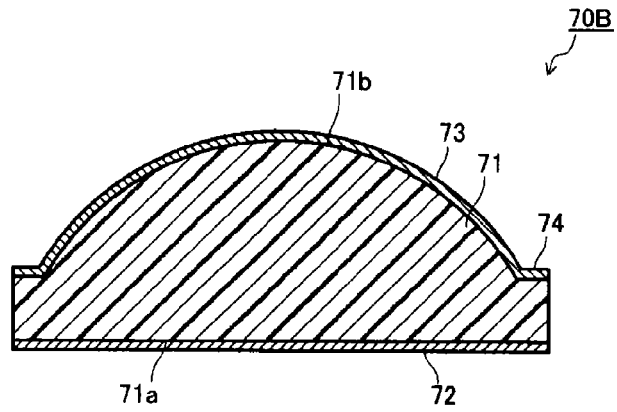
FIG. 8 is a cross-sectional view illustrating a modified example of a lens for an imaging device according to the embodiment of the present invention.
Figure 9:
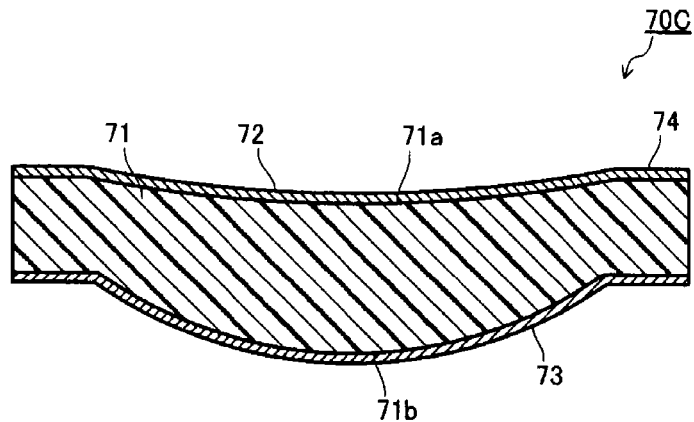
FIG. 9 is a cross-sectional view illustrating a modified example of a lens for an imaging device according to the embodiment of the present invention.

FIGS. 8 and 9 illustrate other examples in which the lens is used as the lens main body 71.

For a lens 70B for an imaging device shown in FIG. 8, a glass plano-convex lens having a planar portion 74 at its periphery is used as the lens main body 71, a near infrared absorbing layer 72 is provided on one surface 71*a* which is planar, and an antireflection film 73 is provided on the other surface 71*b* on the convex surface side. In a lens 70C for an imaging device shown in FIG. 9, a glass concave-convex lens, one surface 71*a* of which has a concave surface, the other side 71*b* of which has a convex surface, and which further has a planar portion 74 at its periphery, is used as the lens main body 71. A near infrared absorbing layer 72 is provided on the surface 71*a* on the concave surface side of the glass concave-convex lens, and an antireflection film 73 is provided on the other surface 71*b* on the convex surface side. A concave-convex lens as shown in FIG. 9 and having a function as a convex lens is called a convex meniscus, and one having a function as a concave lens is called a concave meniscus.

The material constituting the lens main body 71 may, for example, be crystals of rock crystal, lithium niobate, sapphire or the like; glass such as BK7, quartz or low melting point glass for precise press forming; or a plastic such as a polyester resin such as polyethylene terephthalate (PET) or polybutylene terephthalate (PBT), a polyolefin resin such as polyethylene, polypropylene or an ethylene/vinyl acetate copolymer, a norbornene resin, an acrylic resin such as polyacrylate or polymethyl methacrylate, a urethane resin, a vinyl chloride resin, a fluororesin, a polycarbonate resin, a polyvinyl butyral resin or a polyvinyl alcohol resin. Such materials may have absorption properties to light in the ultraviolet region and/or near infrared region. Further, the lens main body 71 may be constituted, for example, by colored glass having CuO or the like added to fluorophosphate glass, phosphate glass or the like. Further, these drawings illustrate examples of a refractive lens, however, a diffraction lens utilizing diffraction such as a Fresnel lens, a hybrid lens utilizing both refraction and diffraction, or the like may also be applicable.

Further, for example, an antireflection film 73 may be provided on one surface 71*a* of the lens main body 71, and a near infrared absorbing layer 72 is provided on the other surface 71*b*. Further, on the other surface 71*b*, a near infrared absorbing layer 72 in the same manner as one surface 71*a* may be formed instead of the antireflection film 73. That is, the near infrared absorbing layer 72 may be provided on both surfaces 71*a* and 71*b* of the lens main body 71.

Further, a dielectric multilayer film or a moth eye structure may be provided on the surface where the near infrared absorbing layer 72 is in contact with the air, whereby the interface reflection can be reduced, and the light utilization efficiency can be increased. The dielectric multilayer film is formed by laminating a film made of a transparent material such as a metal oxide such as silicon oxide, titanium oxide, niobium oxide, tantalum oxide or alumina, a metal fluoride such as magnesium fluoride or a fluororesin, to develop antireflection effects utilizing interference of light. For formation of such a film, for example, a vacuum film formation process such as a CVD method, a sputtering method or a vacuum deposition method, or a wet film formation process such as a spraying method or a dipping method may be employed. The moth eye structure has a regular protrusion arrangement with a period smaller than 400 nm for example, and has a function to suppress the surface reflectance of light having a wavelength longer than the period, as the effective refractive index continuously changes in the thickness direction. The moth eye structure may be formed e.g. by molding.

Figure 10:
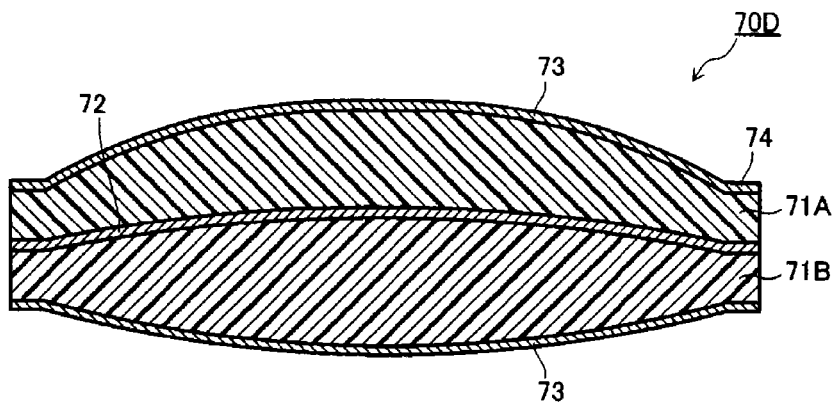
FIG. 10 is a cross-sectional view illustrating a modified example of a lens for an imaging device according to the embodiment of the present invention.

The lens main body 71 may also have a structure comprising a plurality of lenses bonded by an adhesive, and in such a case, the near infrared absorbing layer according to the present invention can be provided on the bonded surface. FIG. 10 illustrates one example of such a lens for an imaging device. In this lens 70D for an imaging device, a lens main body 71 is constituted by two lenses 71A and 71B, each of the lenses 71A and 71B has a planar portion 74 at its periphery, and a near infrared absorbing layer 72 is provided on the bonded surface of the lenses 71A and 71B and an antireflection film 73 is provided on surfaces opposite to the bonding surface. Such a lens 70D for an imaging device may be such that one (for example, the lens 71A) of the two lenses 71A and 71B is provided with the near infrared absorbing layer 72 and bonded to and integrated with the other lens (for example, the lens 71B) by an adhesive, or the two lenses 71A and 71B are bonded by means of the near infrared absorbing layer 72 as an adhesive.

The type of the lenses used for the lens main body 71, whether the antireflection film 73 is provided or not, and the like, are properly determined considering the purpose of use, the types of lenses used in combination, the installation site, etc.

In a case where a lens made of glass is used as the lens main body 71, it may be surface treated with a silane coupling agent so as to increase the adhesion to the near infrared absorbing layer 72 and the antireflection film 73. The silane coupling agent may, for example, be an aminosilane such as γ-aminopropyltriethoxysilane, N-β-(aminoethyl)-γ-aminopropyltrimethoxysilane, N-6-(aminoethyl)-N'-β-(aminoethyl)-γ-aminopropyltriethoxysilane or γ-anilinopropyltrimethoxysilane, an epoxysilane such as γ-glycidoxypropyltrimethoxysilane or β-(3,4-epoxycyclohexyl)ethyltrimethoxysilane, a vinylsilane such as vinyltrimethoxysilane or N-β-(N-vinylbenzylaminoethyl)-γ-aminopropyltrimethoxysilane, γ-methacryloxypropyltrimethoxysilane, γ-chloropropyltrimethoxysilane or γ-mercaptopropyltrimethoxysilane.

In a case where a lens made of a plastic is used as the lens main body 71, it is preferred to apply corona treatment or adhesion-facilitating treatment to the lens surface before the nIR absorbing particle-containing layer 72 or the antireflection film 73 is formed.

Now, the near infrared absorbing layer 72 provided on the lens main body will be described below.

For the nIR absorbing particles contained in the near infrared absorbing layer 72, the same particles as used for the above-described first embodiment are used. Accordingly, all the descriptions regarding the nIR absorbing particles described in the first embodiment are also applicable to this embodiment.

The content of the nIR absorbing particles in the near infrared absorbing layer 72 is preferably at least 20 mass % and at most 60 mass %, more preferably at least 20 mass % and at most 50 mass %, as described in the second embodiment. When the content of the nIR absorbing particles is at least 20 mass %, sufficient near infrared absorbing properties can be imparted to the near infrared absorbing layer 72. Further, when the content of the nIR absorbing particles is at most 60 mass %, the transmittance of light in the visible wavelength region can be maintained high. The contents other than the nIR absorbing particles in the near infrared absorbing layer will be describe below, and may, for example, be a transparent resin as the matrix material of the layer, a dye, an ultraviolet absorbing material, a color calibration dye, a leveling agent, an anti-static agent, a thermal stabilizer, an antioxidant, a dispersing agent, a flame retardant, a lubricant or a plasticizer.

In the near infrared absorbing layer 72, a near infrared or infrared absorbing material other than the nIR absorbing particles may be incorporated. In such a case, the near infrared absorbing layer 72 may have a multilayer structure of a layer containing the nIR absorbing particles and a layer containing the near infrared or infrared absorbing material other than the nIR absorbing particles, or a multilayer structure of a layer containing the nIR absorbing particles and a layer containing the nIR absorbing particles and the near infrared or infrared absorbing material other than the nIR absorbing particles.

The near infrared or infrared absorbing material other than the nIR absorbing particles may, for example, be inorganic fine particles of e.g. ITO (indium tin oxide), ATO (antimony-doped tin oxide) or lanthanum boride or an organic dye. Among them, ITO particles are particularly preferred when light shielding properties in the infrared wavelength region are required, since they have a high transmittance of light in the visible wavelength region and have light absorptivity in a wide range including the infrared wavelength region exceeding 1,200 nm. The ITO particles are contained preferably in a content of at least 0.5 mass % and at most 30 mass %, more preferably at least 1 mass % and at most 30 mass % in the near infrared absorbing layer 72. When the content of the ITO particles is at least 0.5 mass %, a certain effect for light shielding properties in the infrared wavelength region will be obtained. Further, when the content of the ITO particles is at most 30 mass %, such a layer will not absorb light in the visible wavelength region, whereby transparency can be maintained.

The number average aggregated particle size of the ITO particles is preferably at least 5 nm and at most 200 nm, more preferably at least 5 nm and at most 100 nm, further preferably at least 5 nm and at most 70 nm, with a view to suppressing scattering and maintaining the transparency. The organic dye may, for example, be a cyanine compound, a phthalocyanine compound, a naphthalocyanine compound, a dithiol metal complex compound, a diimmonium compound, a polymethine compound, a phthalide compound, a naphthoquinone compound, an anthraquinone compound or an indophenol compound.

Further, in the near infrared absorbing layer 72, another light absorbing material such as an ultraviolet absorbing material may be incorporated. The ultraviolet absorbing material may, for example, be particles of e.g. zinc oxide, titanium oxide, cerium oxide, zirconium oxide, mica, kaolin or sericite. The number average aggregated particle size of such another light absorbing material is preferably at least 5 nm and at most 200 nm, more preferably at least 5 nm and at most 100 nm, further preferably at least 5 nm and at most 70 nm, in view of the transparency.

In the near infrared absorbing layer 72, a transparent resin may further be incorporated. By incorporating a transparent resin, the layer formation of the near infrared absorbing layer 72 will be easy, and durability of the near infrared absorbing layer 72 and thus the lenses 70A to 70D for an imaging device can be increased.

The transparent resin may, for example, be a thermoplastic resin such as a polyester resin, an acrylic resin, a polyolefin resin, a polycarbonate resin, a polyamide resin or an alkyd resin, or a thermosetting resin such as an epoxy resin, a thermosetting acrylic resin or a silsesquioxane resin. In view of the transparency, an acrylic resin or a polyester resin is particularly preferred. The content of the transparent resin in the near infrared absorbing layer 72 is preferably at least 40 mass % and at most 80 mass %, more preferably at least 50 mass % and at most 80 mass %. When the content of the transparent resin is at least 40 mass %, sufficient effects by its use will be obtained, and when it is at most 80 mass %, sufficient near infrared absorbing properties can be maintained.

In the near infrared absorbing layer 72, in addition to the above components, a color calibration dye, a leveling agent, an anti-static agent, a thermal stabilizer, an antioxidant, a dispersing agent, a flame retardant, a lubricant, a plasticizer or the like may further be incorporated within a range not to impair the effects of the present invention.

The near infrared absorbing layer 72 can be formed by dispersing or dissolving the above nIR absorbing particles and other components blended as the case requires in a dispersion medium to prepare a coating liquid, and applying and drying the coating liquid on the lens main body 71. Application and drying may be carried out dividedly in several times. On that occasion, a plurality of coating liquids differing in the components may be prepared, and they are applied and dried in order. Specifically, for example, in the case of containing the ITO particles, a coating liquid containing the nIR absorbing particles and a coating liquid containing the ITO particles are separately prepared, and they are applied and dried on the lens main body 71 in order to form the near infrared absorbing layer 72.

The dispersion medium, the coating liquid, the surfactant, the silane coupling agent, the silicone resin, the titanate coupling agent, the aluminum coupling agent, the zircoaluminate coupling agent, the amount of the dispersing agent and the method for preparing the coating liquid may be the same as employed in the first embodiment. Accordingly, all the descriptions in the first embodiment are also applicable to this embodiment.

For applying the coating liquid, a coating method such as dip coating, spray coating, spin coating, bead coating, gravure coating, or microgravure coating may be employed. In addition, screen printing, flexographic printing or the like may also be employed.

The thickness of the near infrared absorbing layer 72 is preferably within a range of at least 1 μm and at most 200 μm, more preferably within a range of at least 4 μm and at most 100 μm, further preferably within a range of at least 20 μm and at most 50 μm. When it is at least 1 μm, sufficient near infrared absorbing ability can be obtained, and when it is at most 200 μm, remaining of the dispersion medium at the time of the layer formation can be suppressed. When it is at least 4 μm, the flatness of the film thickness is more likely to be obtained, and dispersion of the absorptivity can be reduced. When it is at most 100 μm, flatness of the film thickness is more likely to be obtained and in addition, such is advantageous for reduction in thickness.

The near infrared absorbing layer 72 has a change D' in the transmittance represented by the following formula (3) of preferably at most −0.36, more preferably at most −0.45.

$$D'(\%/nm)=[T_{700}(\%)-T_{630}(\%)]/[700 \text{ (nm)}-630 \text{ (nm)}] \quad (3)$$

wherein $T_{700}$ is a transmittance at a wavelength of 700 nm of the near infrared absorbing layer in a transmission spectrum, and $T_{630}$ is a transmittance at a wavelength of 630 nm of the near infrared absorbing layer in a transmission spectrum.

When the change D' in the transmittance is at most −0.36, the change in the transmittance in wavelengths from 630 to 700 nm will be sufficiently steep, and such a layer is suitable for a lens for an imaging device. When it is at most −0.45, the light utilization efficiency in the visible wavelength region will further be improved while light in the near infrared wavelength region is blocked out, such being advantageous in suppression of noises in imaging at a dark portion.

Further, the transmittance at a wavelength of 715 nm of the near infrared absorbing layer 72 is preferably at most 10%, more preferably at most 5%. The transmittance at a wavelength of 500 nm of the near infrared absorbing layer 72 is preferably at least 80%, more preferably at least 85%. The transmittance of the near infrared absorbing layer can be measured by an ultraviolet visible spectrophotometer.

The antireflection film 73 is formed by laminating a film made of a transparent material such as a metal oxide such as zirconium oxide, cesium oxide, tantalum oxide, alumina, magnesium oxide, yttrium oxide, tin oxide or tungsten oxide, a metal fluoride such as magnesium fluoride, or a fluororesin, to develop antireflection effects by utilizing interference of light. For formation of such a film, for example, a vacuum film formation process such as a CVD method, a sputtering method or a vacuum deposition method or a wet film formation process such as a spraying method or a dipping method may be employed.

As the lenses 70A to 70D for an imaging device according to this embodiment comprise the near infrared absorbing layer 72 according to the present invention, a near infrared cut filter which has been disposed separately can be omitted, and downsizing, reduction in thickness and reduction in the cost of an imaging device can be achieved.

Further, as the near infrared absorbing layer 72 contains near infrared absorbing particles comprising crystallites of the above $A_{1/n}CuPO_4$ compound and having a number average aggregated particle size of at least 20 nm and at most 200 nm, the transmittance of light in the visible wavelength region will be high. Further, as it contains nIR absorbing particles having a low transmittance of light in the near infrared wavelength region, the transmittance of the near infrared absorbing layer 72 steeply changes in wavelengths from 630 to 700 nm, and the lenses 70A to 70D for an imaging device comprising such a layer have good near infrared shielding properties.

Further, as the near infrared absorbing layer 72 can be formed by applying and drying a coating liquid prepared by dispersing the nIR absorbing particles in a dispersion medium on one main surface of the lens main body 71, the lenses 70A to 70D for an imaging device can be produced easily at a low cost.

Fifth Embodiment

The fifth embodiment of the present invention relates to a lens for an imaging device containing near infrared absorbing particles.

Figure 11:
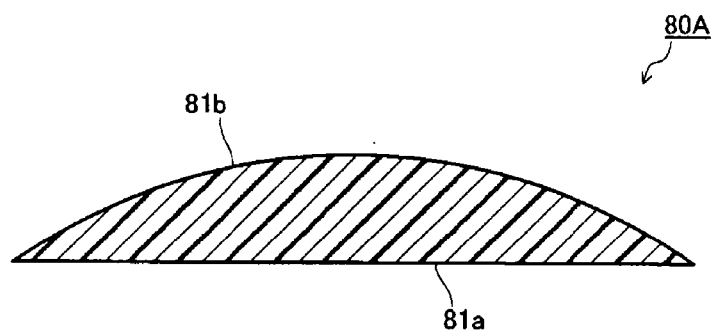
FIG. 11 is a cross-sectional view illustrating one example of a lens for an imaging device according to the embodiment of the present invention.

FIG. 11 is a cross-sectional view illustrating a lens for an imaging device according to this fifth embodiment. This lens for an imaging device is, similar to the lens for an imaging device according to the fourth embodiment, a lens constituting the whole or a part of the lens system for image formation on a solid-state imaging element of an imaging device such as a miniature camera installed in information equipment of e.g. a digital still camera, a digital video camera, a portable phone, a notebook personal computer or a PDA. In this embodiment, in order to avoid overlapping description, description with respect to points in common with the fourth embodiment is omitted, and differences will mainly be described.

As shown in FIG. 11, this lens 80A for an imaging device is a so-called a plano-convex lens, one surface 81a of which is planar and the other surface 81b of which is convex, and the whole thereof is constituted by the above-described nIR absorbing particles, or the nIR absorbing particles and other components blended as the case requires.

Figure 12:
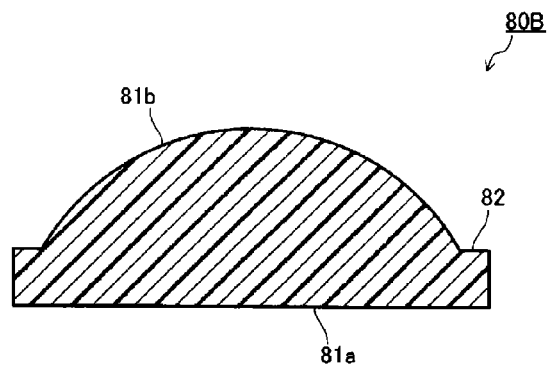
FIG. 12 is a cross-sectional view illustrating a modified example of a lens for an imaging device according to the embodiment of the present invention.
Figure 13:
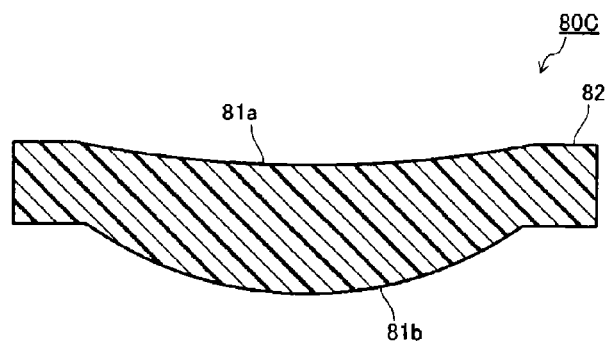
FIG. 13 is a cross-sectional view illustrating a modified example of a lens for an imaging device according to the embodiment of the present invention.

The lens shape is not particularly limited, and for example, it may be a plano-convex lens having a planar portion 82 at its periphery, such as a lens 80B for an imaging device as shown in FIG. 12, or may be a concave-convex lens, one surface 81a of which is concave, the other surface 81b of which is convex, and which has a planar portion 82 at its periphery, such as a lens 80 for an imaging device as shown in FIG. 13. Further, although not shown, an antireflection film may be provided on one surface 81a (or 81b) or both surfaces 81a and 81b of each of the lenses 80A to 80C for an imaging device. The shape of the lens, whether an antireflection film is formed or not, etc. are properly determined considering the purpose of use, the types of the lenses used in combination, the installation site, etc.

Each of the lenses 80A to 80C for an imaging device of this embodiment can be produced, for example, as follows by using a mold for injection molding comprising a fixed mold and a movable mold capable of moving relative to the fixed mold, and having a cavity of the lens shape to be formed between these molds.

First, the nIR absorbing particles according to the present invention and other components blended as the case requires are mixed. In the mold, a gate portion to supply such a mixture to the cavity is provided, and the mixture is supplied to the cavity through this gate portion, and cooled and solidified. Then, the movable mold is moved, and the formed product is separated from the fixed mold and taken out.

Each of the lenses 80A to 80C for an imaging device may be formed also by transfer molding or casting. Further, a multi-cavity mold may be used as the mold. In such a case, after molding, an antireflection film 83 is formed as the case requires, followed by cutting into separate lenses by a dicing device. In such a manner, lenses 80A to 80C for an imaging device can be obtained.

The change D' in the transmittance represented by the following formula (3) of each of the lenses 80A to 80C for an imaging device of this embodiment is preferably at most −0.36, more preferably at most −0.45.

$$D'(\%/nm)=[T_{700}(\%)-T_{630}(\%)]/[700\ (nm)-630\ (nm)] \quad (3)$$

wherein $T_{700}$ is a transmittance at a wavelength of 700 nm of the lens for an imaging device in a transmission spectrum, and $T_{630}$ is a transmittance at a wavelength of 630 nm of the lens for an imaging device in a transmission spectrum.

When the change D' in the transmittance is at most −0.36, the change in the transmittance in wavelengths from 630 nm to 700 nm is sufficiently steep, and such a lens is suitable as a lens for an imaging device. When it is at most −0.45, the light utilization efficiency in the visible wavelength region will further be improved while light in the near infrared wavelength region is blocked out, and such is advantageous in suppression of noises in imaging at a dark portion.

Further, the transmittance at a wavelength of 715 nm of the lenses 80A to 80C for an imaging device is preferably at most 10%, more preferably at most 5%. The transmittance at a wavelength of 500 nm of the lenses 80A to 80C for an imaging device is preferably at least 80%, more preferably at least 85%. The transmittance of the lens for an imaging device can be measured by using an ultraviolet visible spectrophotometer.

According to the fifth embodiment also, the same effects as the fourth embodiment can be obtained. Further, according to this embodiment, as the lens itself contains the nIR absorbing particles, further downsizing and reduction in thickness of an imaging device can be achieved as compared with the fourth embodiment. Further, as a step of forming the lens and a step of forming the near infrared absorbing layer can be carried out in one step, further reduction in the cost and improvement in the productivity can be achieved.

As there is a difference in the lens thickness depending on the optical path of light transmitted, there may be dispersion in the transmission spectral characteristics. To solve such a dispersion, for example, it is preferred to employ a method of using a meniscus lens with a small difference in the lens thickness, a method of changing the density or the like of the nIR absorbing particles depending upon the portion of the lens to offset the difference in the thickness, or a method of combining a plurality of near infrared absorbing lenses differing in the shape and/or the density of the nIR absorbing particles to offset the difference in the thickness, whereby the dispersion in the transmission spectral characteristics due to the difference in the lens thickness can be reduced.

Sixth Embodiment

The sixth embodiment of the present invention relates to an imaging device comprising the lens for an imaging device according to the embodiment of the present invention.

Figure 14:
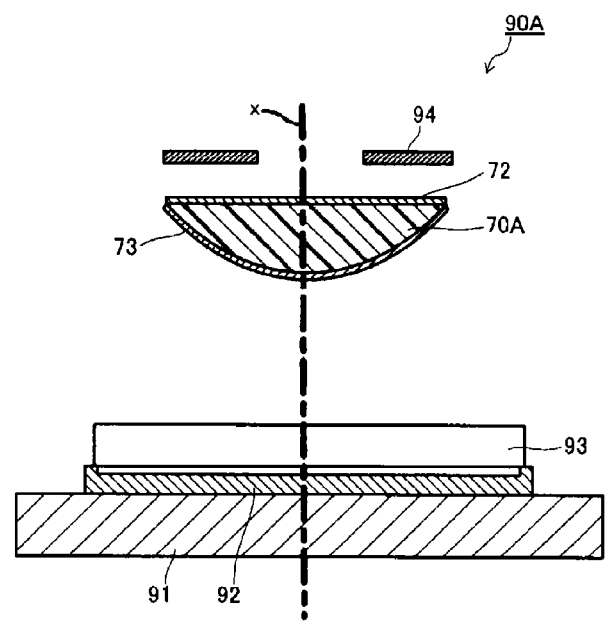
FIG. 14 is a cross-sectional view schematically illustrating a substantial part of one example of an imaging device according to the embodiment of the present invention.

FIG. 14 is a cross-sectional view schematically illustrating a substantial part of an imaging device according to this sixth embodiment. An imaging device 90A of this embodiment comprises, as shown in FIG. 14, a substrate 91, a solid-state imaging element 92 mounted on the substrate 91, a cover glass 93, the above-described lens for an imaging device, for example, a lens 70A for an imaging device, and an aperture stop 94. The solid-state imaging element 92, the lens 70A for an imaging device and the aperture stop 94 are disposed along an axis x.

The solid-state imaging element 92 is an electronic component which converts light transmitted through the lens 70A for an imaging device to electrical signals, and specifically, a CCD or a CMOS may, for example, be used. The cover glass 93 is disposed on the surface on the side of the lens 70A for an imaging device of the solid-state imaging element 92, and has a function to protect the solid-state imaging element 92 from the external environment. The lens 70A for an imaging device is disposed so that the planar side having the near infrared absorbing layer 72 provided thereon faces the aperture stop 94 side i.e. the light incident side, and the convex surface side having the antireflection film 73 provided thereon faces the solid-state imaging element 92 side. The lens 70A for an imaging device may be disposed so that the convex surface side having the antireflection film 73 provided thereon faces the aperture stop 94 side i.e. the light incident side, and the planar side having the near infrared absorbing layer 92 provided thereon faces the solid-state imaging element 92 side.

In the imaging device 90A, light which entered from the aperture of the aperture stop 94 passes through the lens 70A for an imaging device and is received by the solid-state imaging element 92, and the received light is converted to electrical signals by the solid-state imaging element 92 and is output as image signals. As the near infrared absorbing layer 72 is provided on the lens 70A for an imaging device, light with near infrared rays blocked out is received by the solid-state imaging element 92.

As described above, the lens 70A for an imaging device according to the present invention has both function as a lens and function to block out near infrared rays, and accordingly the imaging device 90A comprising such a lens 70A is not required to have a near infrared cut filter which has been necessary, and accordingly downsizing and reduction in thickness of the imaging device can be achieved.

Further, as the near infrared absorbing layer 72A contains near infrared absorbing particles comprising crystallites of a compound represented by $A_{1/n}CuPO_4$ and having a number average aggregated particle size of at least 20 nm and at most 200 nm, the transmittance of light in the visible wavelength region tends to be high. Further, as it contains nIR absorbing particles having a low transmittance of light in the near infrared wavelength region, the transmittance of the near infrared absorbing layer 72 containing such particles steeply changes in wavelengths from 630 to 700 nm, and with respect to the imaging device 90A comprising such a layer, a change in color properties between the center portion and the peripheral portion of an image, as observed in a near infrared shielding dielectric multilayer film, or a ghost, will not occur, and an image with good quality can be obtained.

Further, as the lens 70A for an imaging device comprising the near infrared absorbing layer 72 according to the present invention can be produced easily at a low cost, the reduction in the cost can be achieved.

In FIG. 14, the lens system of the imaging device 90A is constituted only by one lens, but may be constituted by a plurality of lenses. In such a case, at least one lens should be the lens for an imaging device of the present invention, and the other lenses may be conventional lenses. The disposition of the lens for an imaging device of the present invention is not particularly limited.

Figure 15:
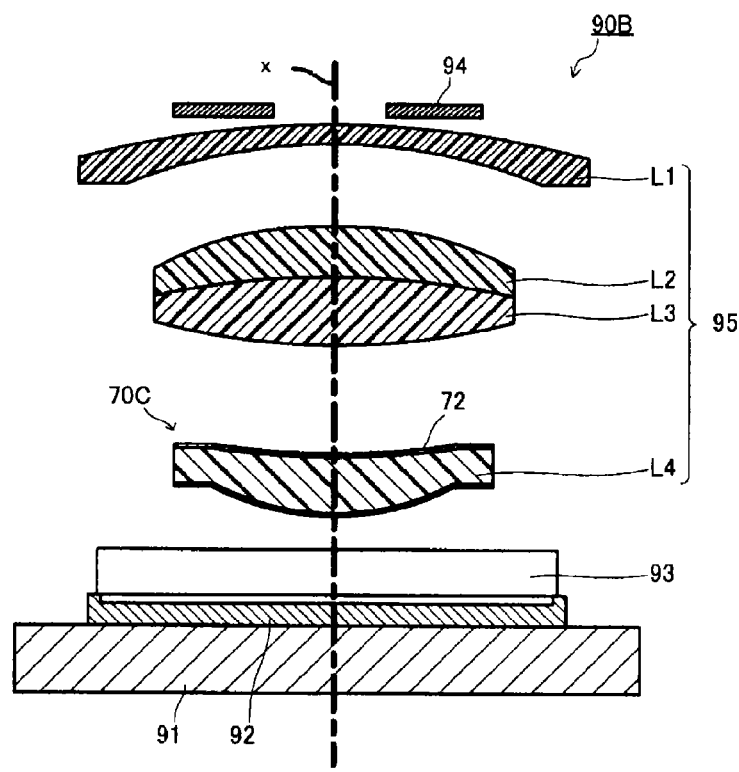
FIG. 15 is a cross-sectional view schematically illustrating a substantial part of another example of an imaging device according to the embodiment of the present invention.

FIG. 15 illustrates one example of an imaging device 90B in which the lens system comprises a plurality of lenses. This imaging device 90B comprises a substrate 91, a solid-state imaging element 92 mounted on the substrate 91, a cover glass 93, a group 95 of a plurality of lenses, and an aperture stop 94. In FIG. 15, regarding the group 95 of a plurality of lenses, a first lens L1, a second lens L2, a third lens L3 and a fourth lens L4 are disposed in this order from the aperture stop 94 side to the imaging surface of the solid-state imaging element 92, and the lens 70C for an imaging device according to the present invention is used for the fourth lens L4 disposed closest to the solid-state imaging element 92.

In this imaging device 90B also, as the lens 70C for an imaging device has both function as a lens and function to block out near infrared rays, the imaging device 90B is not required to have a near infrared cut filter which has been required, whereby downsizing the reduction in thickness of the imaging device can be achieved.

Further, as the near infrared absorbing layer 72 contains near infrared absorbing particles comprising crystallites of a compound represented by $A_{1/n}CuPO_4$ and having a number average aggregated particle size of at least 20 nm and at most 200 nm, the transmittance of light in the visible wavelength region is high. Further, as it contains nIR absorbing particles having a low transmittance of light in the near infrared wavelength region, the transmittance of the near infrared absorbing layer 72 containing such particles steeply changes in wavelengths from 630 to 700 nm, and with respect to the imaging device 90B comprising such a layer, a change in color properties between the center portion and the peripheral portion of an image, as observed in a near infrared shielding dielectric multilayer film, or a ghost, will not occur, and an image with good quality can be obtained.

Further, the lens for an imaging device comprising the near infrared absorbing layer 72 according to the present invention can be produced easily at a low cost, and accordingly the reduction in the cost of the imaging device 90B can be achieved.

EXAMPLES

Now, the present invention will be described in further detail with reference to Examples. Various physical properties, etc. in Examples were measured by the following methods.

[X-Ray Diffraction]

With respect to nIR absorbing particles in a powder state, X-ray diffraction measurement was carried out by using an X-ray diffractometer (RINT-TTR-III manufactured by Rigaku Corporation) to identify the crystal structure. Further, the size of crystallites was obtained by calculation by Scherrer's method with respect to reflection at $2\theta=14°$.

[Number Average Aggregated Particle Size]

With respect to a dispersion (solid content concentration: 5 mass %) for particle size measurement having nIR absorbing particles dispersed in water, the number average aggregated particle size was measured by using a dynamic light scattering particle size distribution measuring apparatus (Microtrack ultrafine particle size analyzer UPA-150 manufactured by NIKKISO CO., LTD.).

[Reflectance and Change D in Reflectance]

With respect to nIR absorbing particles in a powder state, the diffuse reflectance spectrum (reflectance) was measured and calculated by using an ultraviolet visible spectrophotometer (U-4100 manufactured by Hitachi High-Technologies Corporation). As the base line, barium sulfate was used.

[Transmittance and Change D' in Transmittance]

With respect to an optical member (or a near infrared absorbing layer), the transmission spectrum (transmittance) was measured and calculated by using an ultraviolet visible spectrophotometer (U-4100 manufactured by Hitachi High-Technologies Corporation).

[Preparation of nIR Absorbing Particles]

While 500 g of a 52 mass % dipotassium hydrogen phosphate (manufactured by JUNSEI CHEMICAL CO., LTD.) aqueous solution was stirred, 500 g of a 5 mass % copper sulfate pentahydrate (manufactured by JUNSEI CHEMICAL CO., LTD.) aqueous solution was added and stirred at room temperature for 5 hours or longer to obtain a light blue solution ($PO_4^{3-}/Cu^{2+}$ (molar ratio)=15).

The product was separated by suction filtration from the obtained light blue solution, and washed with water and acetone to obtain a light blue product. The product was put in a crucible, vacuum dried at 100° C. for 4 hours and dry pulverized for 30 seconds twice by using Wonder Blender (manufactured by Osaka Chemical Co., Ltd., the same applies hereinafter).

The product in a powder state was put in a crucible and fired in the air at 600° C. for 8 hours to obtain a lime green fired product. The fired product was dry pulverized for 30 seconds twice by using Wonder Blender. 15.4 g of the lime green fired product was obtained, and the yield was 78% based on the number of mols of copper sulfate pentahydrate.

X-ray diffraction measurement of the fired product was carried out. From the results of X-ray diffraction, the crystal structure of $KCuPO_4$ was confirmed, and the fired product was identified as particles substantially comprising crystallites of $KCuPO_4$.

The above fired product was dispersed in water to prepare a dispersion having a solid content concentration of 10 mass %, treated by an ultrasonic homogenizer and wet pulverized by using a wet atomization device (Star Burst Mini manufactured by Sugino Machine Limited). The number of the wet pulverization treatment after which the dispersion passes through an orifice size is regarded as the wet pulverization treatment time. In this example, the wet pulverization treatment time was 20 times.

A crushed product was separated by centrifugal separation from the dispersion after wet pulverization, put in a crucible and dried at 150° C. to obtain a lime green crushed product. The crushed product was dry pulverized for 30 seconds twice by using Wonder Blender.

X-ray diffraction measurement was carried out with respect to the crushed product. From the results of X-ray diffraction, the crystal structure of $KCuPO_4$ was confirmed, and the crushed product was identified as nIR absorbing particles substantially comprising crystallites of $KCuPO_4$. The size of the crystallites was 27 nm. Further, a dispersion for measuring the particle size of the nIR absorbing particles was prepared and the number average aggregated particle size was measured, whereupon it was 89 nm. Further, the diffuse reflectance spectrum (reflectance) of the nIR absorbing particles was measured and the change D in the reflectance was obtained, whereupon it was −0.46%/nm.

Production of Film-Form Optical Member (Optical Film)

Example 1

Figure 16:
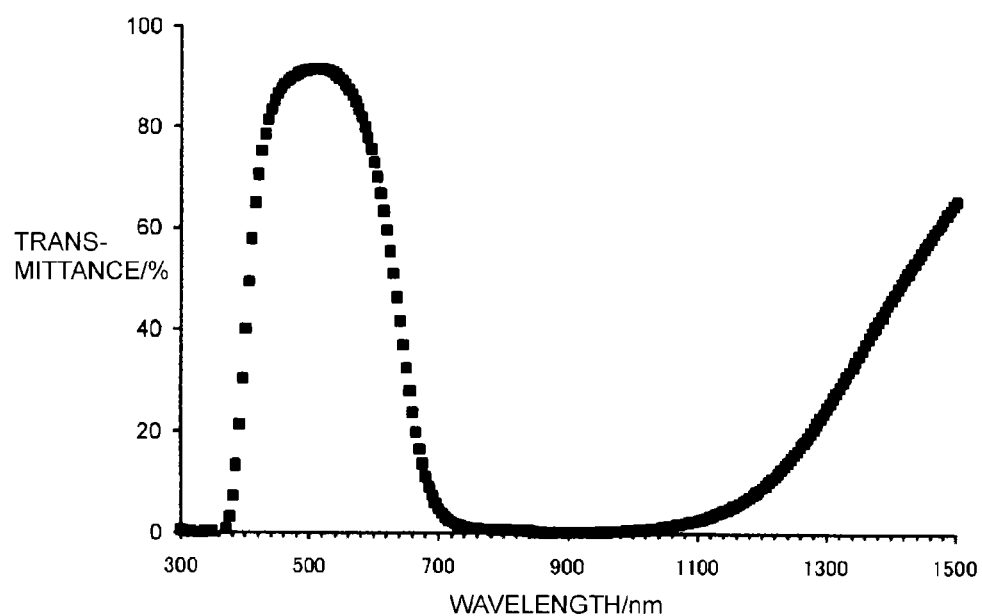
FIG. 16 illustrates a transmission spectrum of an optical member according to one example of the present invention.

The nIR absorbing particles obtained by the above production process and a methacrylic resin (manufactured by ADELL Corporation, tradename: HV153, refractive index: 1.63) were mixed in such a ratio that the solid content comprised 37 mass % of the nIR absorbing particles and 63 mass % of the methacrylic resin, and zirconia beads having a diameter of 0.5 mm were added to the mixed liquid and pulverization was carried out by a ball mill to obtain a dispersion. The obtained dispersion was applied to a glass plate (soda glass) having a thickness of 1.3 mm having release treatment applied to its surface with a fluorinated release agent (tradename: Cytop manufactured by Asahi Glass Company, Limited) by a spin coater (spin coater MS-A200 manufactured by Mikasa Co., Ltd.) and dried by heating at 120° C. for one minute, and then the coating was separated from the glass plate to prepare an optical film having a thickness of 100 μm. This optical film corresponds to the film-form optical member according to the first embodiment of the present invention. The transmittance of this optical film was measured. The results are shown in Table 1 and FIG. 16 (transmission spectrum).

Example 2

The nIR absorbing particles and a 30 mass % cyclohexanone solution of a polyester resin (tradename: VYLON 103 manufactured by TOYOBO CO., LTD., refractive index: 1.60 to 1.61) were mixed in such a ratio that the solid content comprised 44 mass % of the nIR absorbing particles and 56 mass % of the polyester resin, and stirred by a rotational/orbital-motion mixer to obtain a dispersion. The obtained dispersion was applied on a glass plate (float plate glass manufactured by Asahi Glass Company, Limited, type: clear FL3.5) having a thickness of 3.5 mm having release treatment applied to its surface with a silicone release agent (tradename: KS700 manufactured by Shin-Etsu Chemical Co., Ltd.) by a film applicator (No. 548-YKG manufactured by YASUDA SEIKI SEISAKUSHO, LTD.) and heated at 150° C. for 15 minutes to form a near infrared absorbing layer (I) (hereinafter referred to as absorbing layer (I)) having a thickness of 50 μm.

Figure 17:
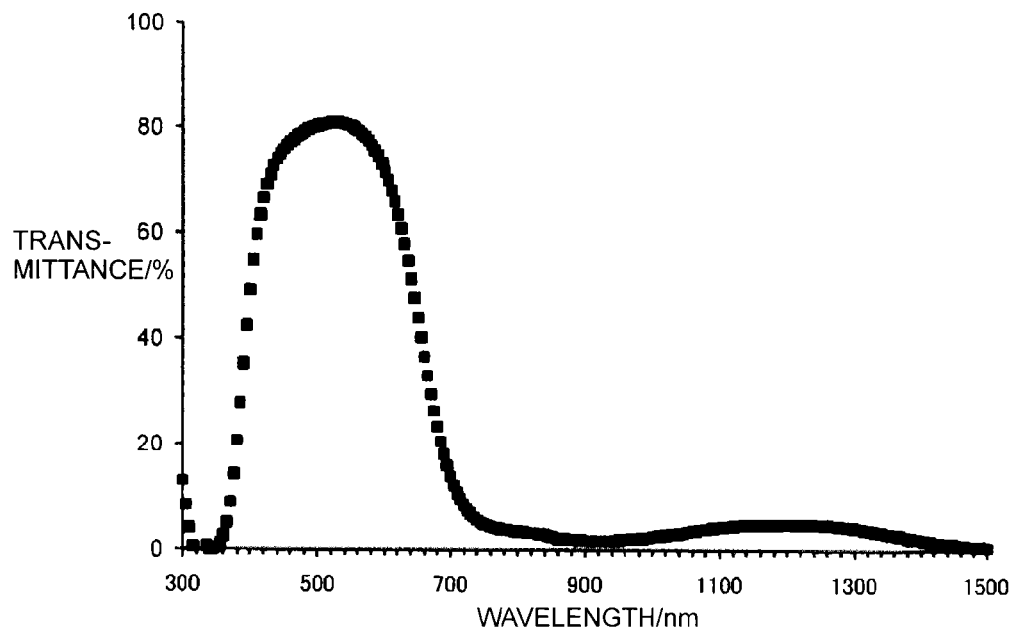
FIG. 17 illustrates a transmission spectrum of two near infrared absorbing layers of a near infrared absorbing layer (I) and a near infrared absorbing layer (II) of an optical member of another example of the present invention.

Further, ITO particles (manufactured by Fuji Titanium Industry Co., Ltd., the size of crystallites: 38 nm) were mixed with ethanol together with a dispersing agent to obtain a dispersion having a solid content concentration of 20 wt %. This ITO particle-containing dispersion was applied on the near infrared absorbing layer (I) by a spin coater (spin coater MS-A200) and heated at 150° C. for 15 minutes to form a near infrared absorbing layer (hereinafter referred to as absorbing layer (II)) having a thickness of 4 μm, and the absorbing layer (II) together with the absorbing layer (I) was separated from the glass plate to prepare an optical film. This optical film corresponds to the film-form optical member according to the first embodiment of the present invention. The transmittance of the absorbing film having a two layer structure comprising the absorbing layer (I) and the absorbing layer (II) was measured. The results are shown in Table 1 and FIG. 17 (transmission spectrum).

Figure 18:
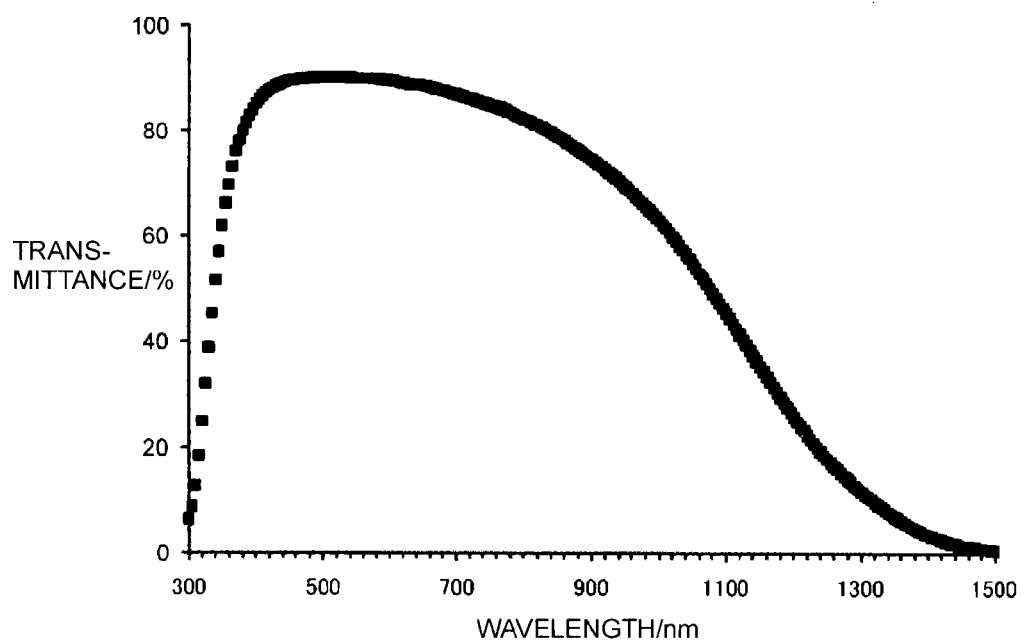
FIG. 18 illustrates a transmission spectrum of a near infrared absorbing layer (II) of an optical member of another example of the present invention.

Further, separately from the preparation of the optical film, the above ITO particle-containing dispersion was applied on a glass plate (float plate glass manufactured by Asahi Glass Company, Limited, type: clear FL3.5) having a thickness of 3.5 mm by a film applicator (No. 548-YKG manufactured by YASUDA SEIKI SEISAKUSHO, LTD.) and heated at 150° C. for 15 minutes to form a near infrared absorbing layer (absorbing layer (II)) having a thickness of 4 μm, and its transmittance was measured. The results obtained by subtracting the transmittances measured with respect to the glass plate having a thickness of 3.5 mm before the ITO particle-containing dispersion was applied, from the above obtained transmittances, are shown in FIG. 18 (transmission spectrum).

Example 3

Figure 19:
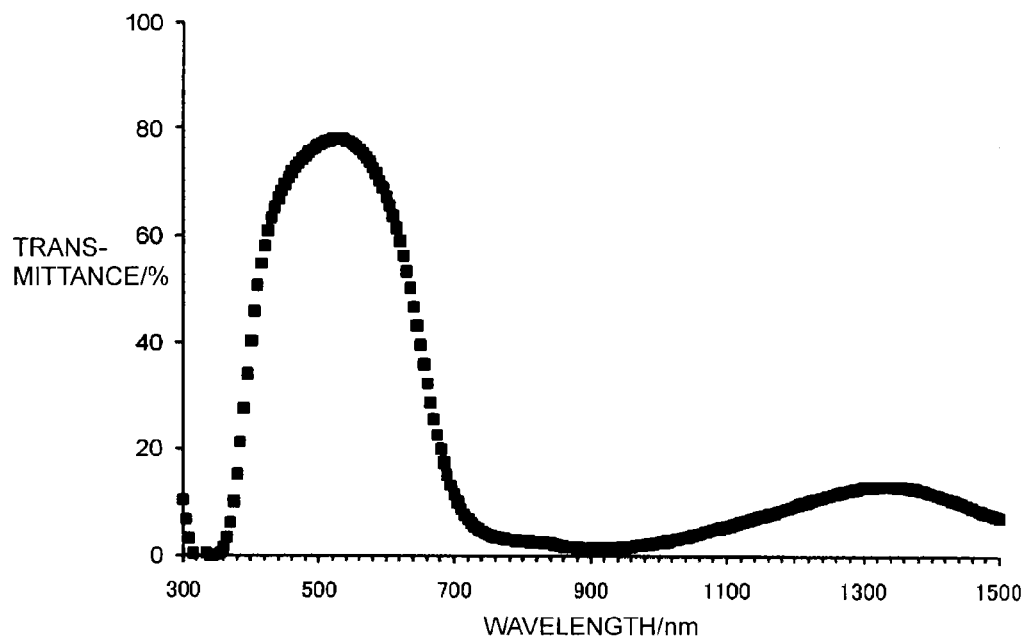
FIG. 19 illustrates a transmission spectrum of an optical member in another example of the present invention.

The nIR absorbing particles obtained by the above production process, the ITO particles (manufactured by Fuji Titanium Industry Co., Ltd.) used in Example 2 and a 30 mass % cyclohexanone solution of a polyester resin (tradename: VYLON 103) were mixed in such a ratio that the solid content comprised 50 mass % of the nIR absorbing particles, 3 mass % of the ITO particles and 46 mass % of the polyester resin, and stirred by a rotational/orbital-motion mixer to obtain a dispersion. The obtained dispersion was applied on a slide glass (soda glass manufactured by MUTO PURE CHEMICALS CO., LTD.) having a thickness of 1.3 mm having release treatment applied to its surface with a silicone release agent (tradename: KS700) by a film applicator (No. 548-YKG manufactured by YASUDA SEIKI SEISAKUSHO, LTD.) and dried by heating at 150° C. for 15 minutes, and the coating was separated from the slide glass to prepare an optical film having a thickness of 50 μm. The transmittance of the optical film was measured. The results are shown in Table 1 and FIG. 19 (transmission spectrum).

Example 4 nIR absorbing particles (number average aggregated particle size: 65 nm) obtained by size classification from the above nIR absorbing particles and an epoxy resin (tradename: EX1011 manufactured by NAGASE & CO., LTD., refractive index: 1.62) were mixed in such a ratio that the solid content comprised 37 mass % of the nIR absorbing particles and 63 mass % of the epoxy resin, and zirconia beads having a diameter of 0.5 mm were added to the mixed liquid and pulverization was carried out by a ball mill to obtain a dispersion. The obtained dispersion was applied on a glass plate (soda glass) having a thickness of 1.3 mm having release treatment applied to its surface with a silicone release agent (tradename: KS700) by a spin coater (spin coater MS-A200) and heated at 100° C. for one hour and at 180° C. further for 4 hours, and the coating was separated from the glass plate to prepare an optical film having a thickness of 100 μm. This optical film corresponds to a film-form optical member according to the first embodiment of the present invention.

The transmittance of this optical film was measured. The results are shown in Table 1.

Production of Near Infrared Cut Filter

Figure 20:
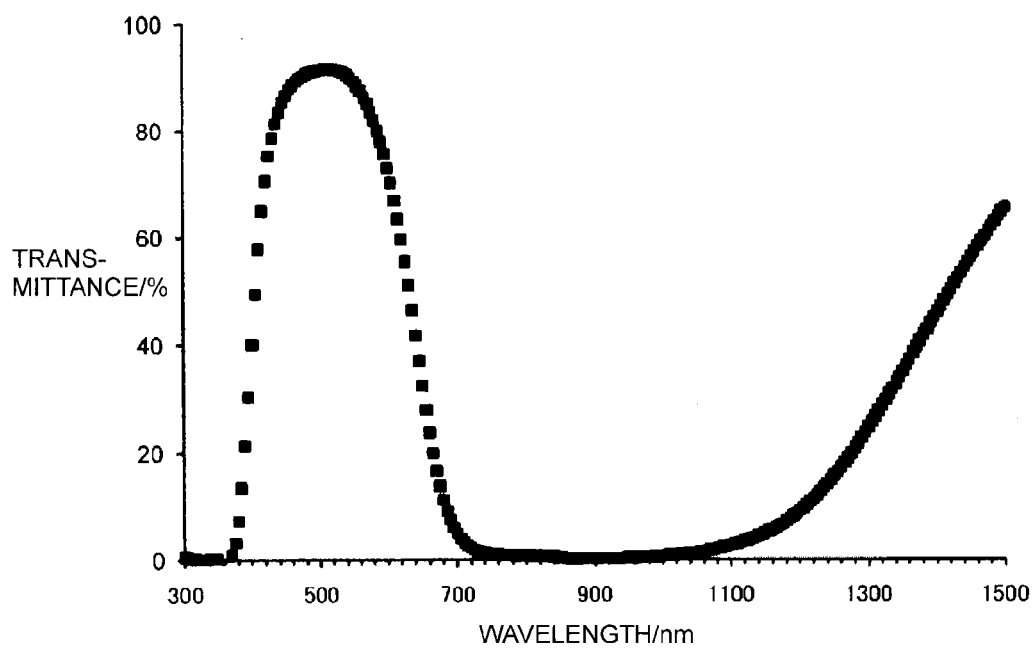
FIG. 20 illustrates a transmission spectrum of a near infrared cut filter according to an example of the present invention.

Example 5 nIR absorbing particles obtained by the above production process and a methacrylic resin (tradename: HV153 manufactured by ADELL Corporation, refractive index: 1.63) were mixed in such a ratio that the solid content comprised 37 mass % of the nIR absorbing particles and 63 mass % of the methacrylic resin, and zirconia beads having a diameter of 0.5 mm were added to the mixed liquid and pulverization was carried out by a ball mill to obtain a dispersion. The obtained dispersion was applied on a glass plate (soda glass) having a thickness of 1.3 mm by a spin coater (spin coater MS-A200 manufactured by Mikasa Co., Ltd.) and dried by heating at 120° C. for one minute to prepare an optical filter having a thickness of 100 μm. This optical filter corresponds to the near infrared cut filter according to the second embodiment of the present invention. Employing a glass plate having a thickness of 1.3 mm as the base line, the transmittance of this optical filter was measured. The results are shown in Table 2 and FIG. 20 (transmission spectrum).

Example 6

The above nIR absorbing particles and a 30 mass % cyclohexanone solution of a polyester resin (tradename: VYLON 103 manufactured by TOYOBO CO., LTD., refractive index: 1.60 to 1.61) were mixed in such a ratio that the solid content comprised 44 mass % of the nIR absorbing particles and 56 mass % of the polyester resin, and stirred by a rotational/orbital-motion mixer to obtain a dispersion. The obtained dispersion was applied on a glass plate (float plate glass manufactured by Asahi Glass Company, Limited, type: clear FL3.5) having a thickness of 3.5 mm by a film applicator (No. 548-YKG manufactured by YASUDA SEIKI SEISAKUSHO, LTD.) and heated at 150° C. for 15 minutes to form a near infrared absorbing layer (III) (hereinafter referred to as absorbing layer (III)) having a thickness of 50 μm.

Further, ITO particles (manufactured by Fuji Titanium Industry Co., Ltd., size of crystallites: 38 nm) were mixed with ethanol together with a dispersing agent to obtain a dispersion having a solid content concentration of 20 wt %.

Figure 21:
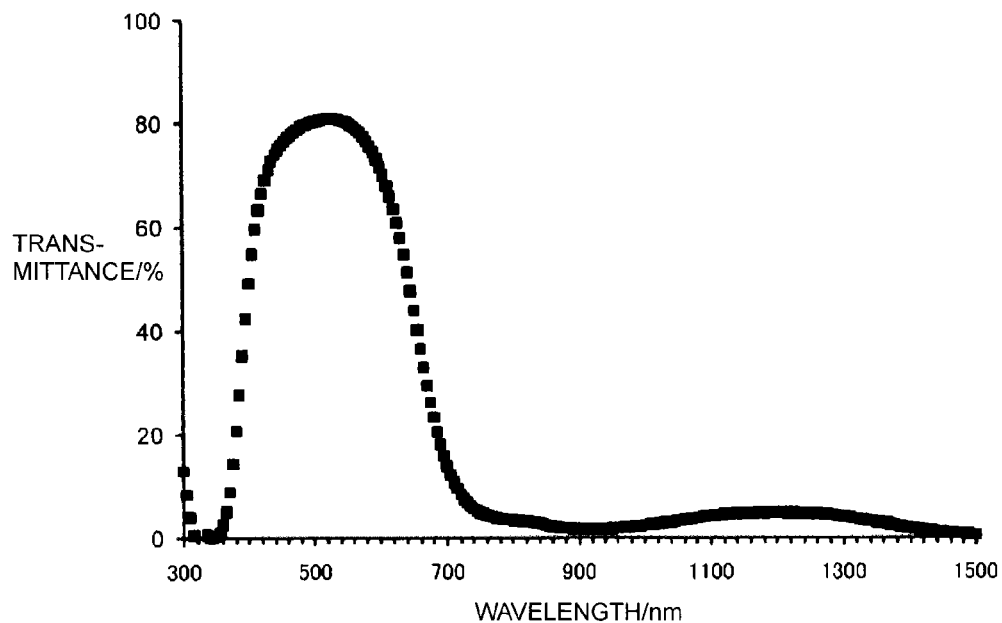
FIG. 21 illustrates a transmission spectrum of an absorbing film comprising two layers of an absorbing layer (III) and an absorbing layer (IV) of a near infrared cut filter according to an example of the present invention.

This ITO particle-containing dispersion was applied on the near infrared absorbing layer (III) by a spin coater (spin coater MS-A200) and heated at 150° C. for 15 minutes to form a near infrared absorbing layer (hereinafter referred to as absorbing layer (IV)) having a thickness of 4 μm to prepare an optical filter. This optical filter corresponds to the near infrared cut filter according to the second embodiment of the present invention. Employing a glass plate having a thickness of 3.5 mm as the base line, the transmittance of the absorbing film having a two layer structure comprising the absorbing layer (III) and the absorbing layer (IV) was measured. The results are shown in Table 2 and FIG. 21 (transmission spectrum).

Figure 22:
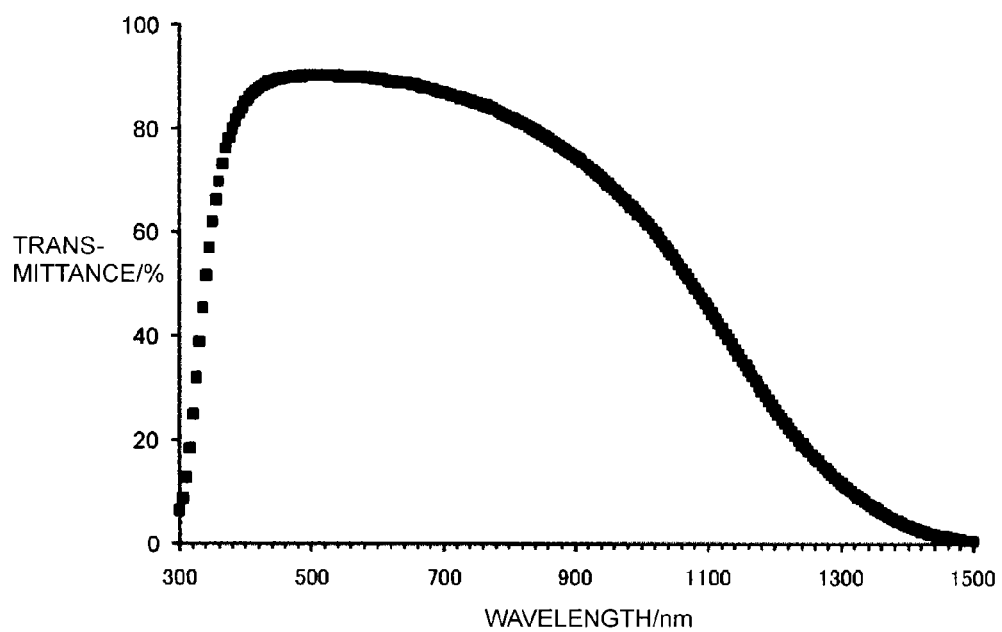
FIG. 22 illustrates a transmission spectrum of a near infrared cut filter according to another example of the present invention.

Further, separately from the preparation of the optical filter, the above ITO particle-containing dispersion was applied on a glass plate (float plate glass manufactured by Asahi Glass Company, Limited, type: clear FL3.5) having a thickness of 3.5 mm by a film applicator (No. 548-YKG manufactured by YASUDA SEIKI SEISAKUSHO, LTD.) and heated at 150° C. for 15 minutes to form a near infrared absorbing layer (absorbing layer (II)) having a thickness of 4 μm, and its transmittance was measured. The results obtained by subtracting the transmittances measured with respect to the glass plate having a thickness of 3.5 mm before the ITO particle-containing dispersion was applied, from the above obtained transmittances, are shown in FIG. 22 (transmission spectrum).

Figure 23:
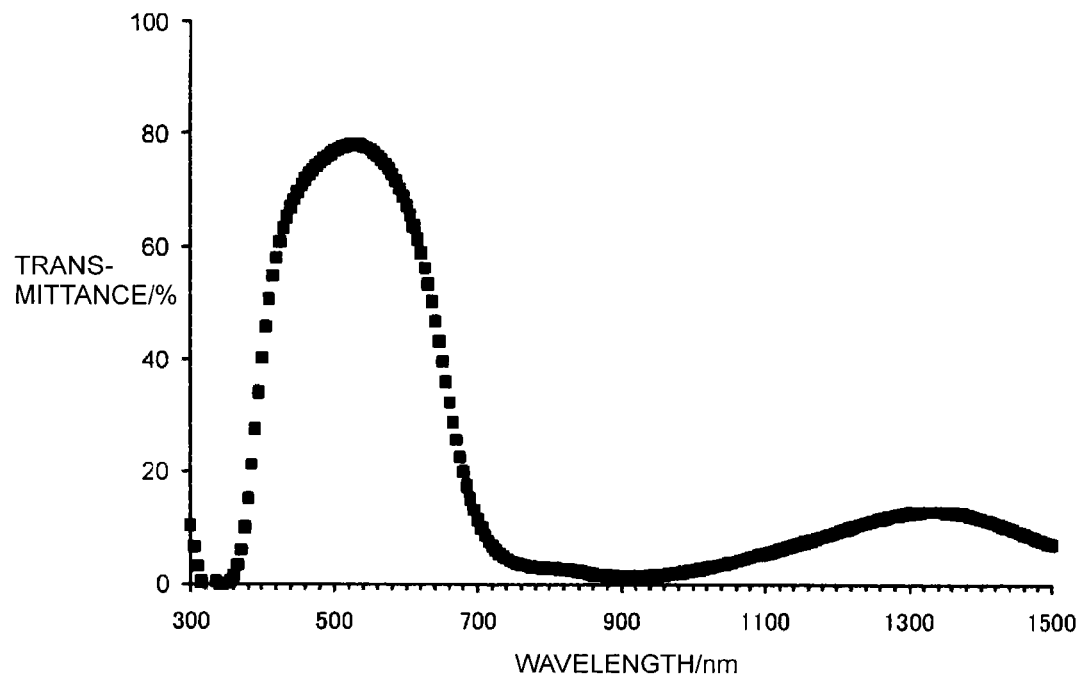
FIG. 23 illustrates a transmission spectrum of a near infrared cut filter according to another example of the present invention.

Example 7 nIR absorbing particles obtained by the above production process, the ITO particles (manufactured by Fuji Titanium Industry Co., Ltd.) used in Example 6 and a 30 mass % cyclohexanone solution of a polyester resin (tradename: VYLON 103) were mixed in such a ratio that the solid content comprised 50 mass % of the nIR absorbing particles, 3 mass % of the ITO particles and 46 mass % of the polyester resin, and stirred by a rotational/orbital-motion mixer to obtain a dispersion. The obtained dispersion was applied on a slide glass (soda glass manufactured by MUTO PURE CHEMICALS CO., LTD.) having a thickness of 1.3 mm by a film applicator (No. 548-YKG manufactured by YASUDA SEIKI SEISAKUSHO, LTD.) and dried by heating at 150° C. for 15 minutes to prepare an optical film having a thickness of 50 μm. Employing a slide glass having a thickness of 1.3 mm as the base line, the transmittance of this optical filter was measured. The results are shown in Table 2 and FIG. 23 (transmission spectrum).

Example 8 nIR absorbing particles (number average aggregated particle size: 65 nm) obtained by size classification from the above nIR absorbing particles and an epoxy resin (tradename: EX1011 manufactured by NAGASE & CO., LTD., refractive index: 1.62) were mixed in such a ratio that the solid content comprised 37 mass % of the nIR absorbing particles and 63 mass % of the epoxy resin, and zirconia beads having a diameter of 0.5 mm were added to the mixed liquid and pulverization was carried out by a ball mill to obtain a dispersion. The obtained dispersion was applied on a glass plate (soda glass) having a thickness of 1.3 mm by a spin coater (spin coater MS-A200) and heated at 100° C. for one hour and at 180° C. further for 4 hours, to prepare an optical filter having a thickness of 100 μm. This optical filter corresponds to the near infrared cut filter according to the second embodiment of the present invention. Employing a glass plate having a thickness of 1.3 mm as the base line, the transmittance of this optical filter was measured. The results are shown in Table 2.

Production of Solid-State Imaging Element

Figure 24:
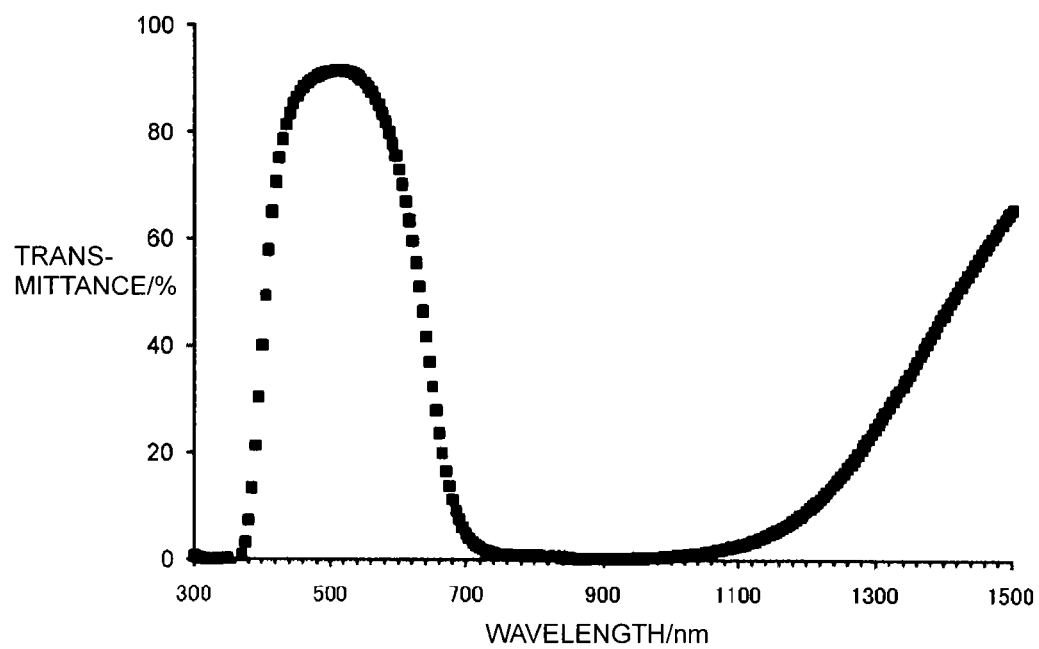
FIG. 24 illustrates a transmission spectrum of a solid-state imaging element according to an example of the present invention.

Example 9 nIR absorbing particles obtained by the above production process and a methacrylic resin (tradename: HV153 manufactured by ADELL Corporation, refractive index: 1.63) were mixed in such a ratio that the solid content comprised 37 mass % of the nIR absorbing particles and 63 mass % of the methacrylic resin, and zirconia beads having a diameter of 0.5 mm were added to the mixed liquid and pulverization was carried out by a ball mill to obtain a dispersion. The obtained dispersion was applied on the surface of a semiconductor substrate 103 having photoelectric conversion elements 101, a light shielding layer 102 and a planarizing layer 104 formed thereon as shown in FIG. 3, i.e. on the surface of the planarizing layer 104, by a spin coater (spin coater MS-A200 manufactured by Mikasa Co., Ltd.) and dried by heating at 120° C. for one minute to form a near infrared absorbing layer 107 having a thickness of 100 µm. Then, on the near infrared absorbing layer, a color filter layer 105 and a microlens 106 were formed in this order to prepare a solid-state imaging element. This solid-state imaging element corresponds to the solid-state imaging element according to the third embodiment of the present invention. Separately from this, on a glass plate (soda glass) having a thickness of 1.3 mm, the same film as the above near infrared absorbing layer 107 was formed in the same manner, and its transmittance was measured employing a glass plate having a thickness of 1.3 mm as the base line. The results are shown in Table 3 and FIG. 24 (transmission spectrum).

Example 10

The above nIR absorbing particles and a 30 mass % cyclohexanone solution of a polyester resin (tradename: VYLON 103 manufactured by TOYOBO CO., LTD., refractive index: 1.60 to 1.61) were mixed in such a ratio that the solid content comprised 44 mass % of the nIR absorbing particles and 56 mass % of the polyester resin and stirred by a rotational/orbital-motion mixer to obtain a dispersion. The obtained dispersion was applied on the surface of a semiconductor substrate 103 having photoelectric conversion elements 101, a light shielding layer 102 and a planarizing layer 104 formed thereon as shown in FIG. 3, i.e. on the surface of the planarizing layer 104 by a film applicator (No. 548-YKG manufactured by YASUDA SEIKI SEISAKUSHO, LTD.) and heated at 150° C. for 15 minutes to form a near infrared absorbing layer (V) having a thickness of 50 µm.

Further, ITO particles (manufactured by Fuji Titanium Industry Co., Ltd., the size of crystallites: 38 nm) were mixed with ethanol together with a dispersing agent to obtain a dispersion having a solid content concentration of 20 wt %.

Figure 25:
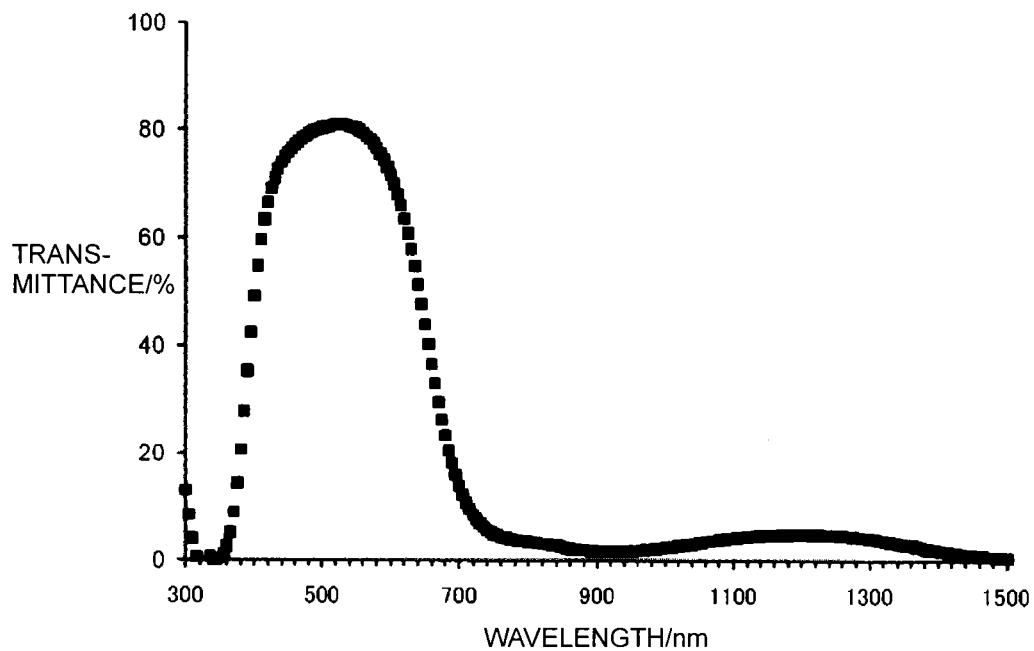
FIG. 25 illustrates a transmission spectrum of an absorbing film comprising two layers of an absorbing layer (V) and an absorbing layer (VI) of a solid-state imaging element according to an example of the present invention.

This ITO particle-containing dispersion was applied on the above near infrared absorbing layer (V) by a spin coater (spin coater MS-A200) and heated at 150° C. for 15 minutes to form a near infrared absorbing layer (IV) having a thickness of 4 µm. Then, on the absorbing layer (VI), a color filter layer 105 and a microlens 106 were formed in this order to prepare a solid-state imaging element. This solid-state imaging element corresponds to the solid-state imaging element according to the third embodiment of the present invention. Separately from this, on a glass plate (float plate glass manufactured by Asahi Glass Company, Limited, type: clear FL3.5) having a thickness of 3.5 mm, the same film as the absorbing layer (V) was formed in the same manner and further the same film as the absorbing layer (VI) was formed in the same manner. The transmittance of the absorbing film having a two layer structure comprising the absorbing layer (V) and the absorbing layer (VI) was measured employing a glass plate having a thickness of 3.5 mm as the base line. The results are shown in Table 3 and FIG. 25 (transmission spectrum).

Figure 26:
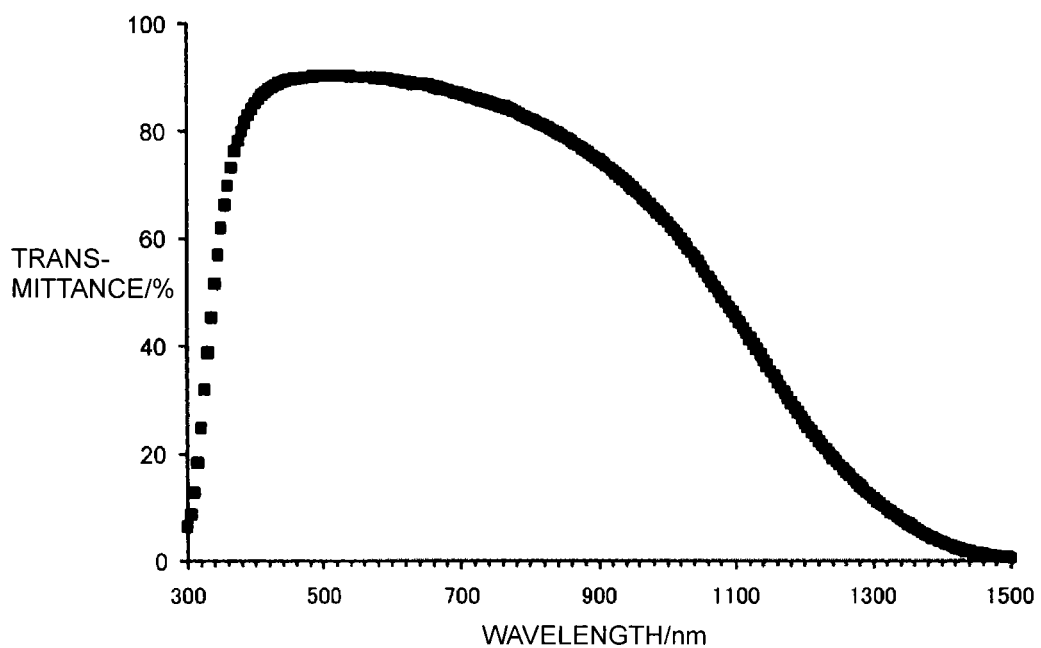
FIG. 26 illustrates a transmission spectrum of a solid-state imaging element according to another example of the present invention.

Further, separately from the preparation of the solid-state imaging element, the above ITO particle-containing dispersion was applied on a glass plate (float plate glass manufactured by Asahi Glass Company, Limited, type: clear FL3.5) having a thickness of 3.5 mm by a film applicator (No. 548-YKG manufactured by YASUDA SEIKI SEISAKUSHO, LTD.) and heated at 150° C. for 15 minutes to form a near infrared absorbing layer (absorbing layer (VI)) having a thickness of 4 µm, and its transmittance was measured. The results obtained by subtracting the transmittances measured with respect to the glass plate having a thickness of 3.5 mm before the ITO particle-containing dispersion was applied, from the above measured transmittances, are shown in FIG. 26 (transmission spectrum).

Figure 27:
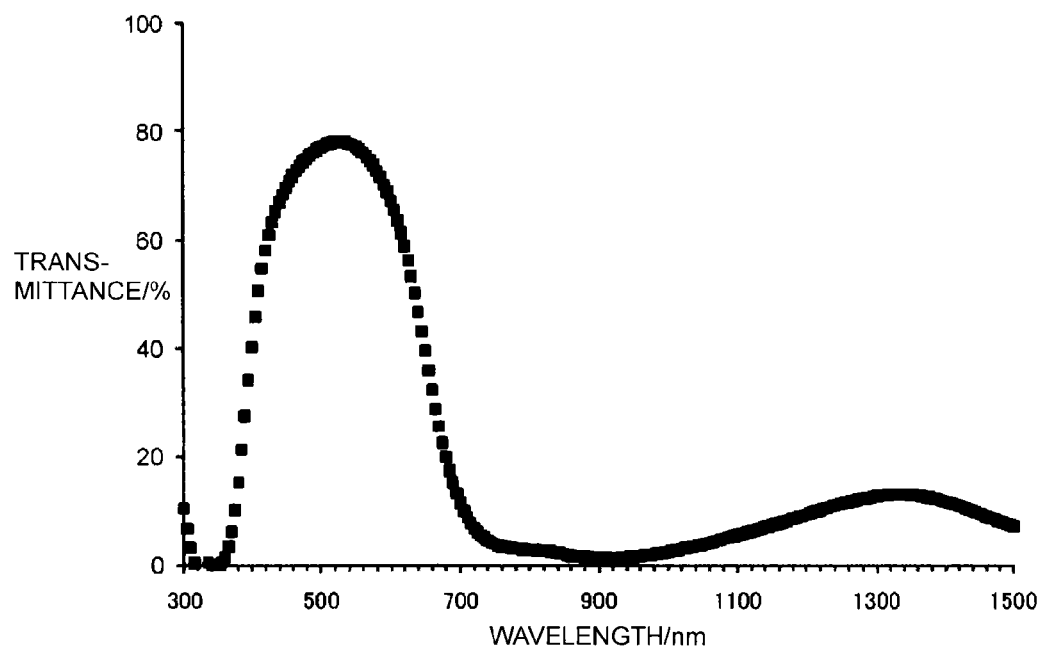
FIG. 27 illustrates a transmission spectrum of a solid-state imaging element according to another example of the present invention.

Example 11 nIR absorbing particles obtained by the above production process, the ITO particles (manufactured by Fuji Titanium Industry Co., Ltd.) used in Example 10 and a 30 mass % cyclohexanone solution of a polyester resin (tradename: VYLON 103) were mixed in such a ratio that the solid content comprised 50 mass % of the nIR absorbing particles, 3 mass % of the ITO particles and 46 mass % of the polyester resin and stirred by a rotational/orbital-motion mixer to obtain a dispersion. The obtained dispersion was applied on the surface of a semiconductor substrate 103 having photoelectric conversion elements 101, a light shielding layer 102 and a planarizing layer 104 formed thereon as shown in FIG. 3, i.e. on the surface of the planarizing layer 104, by a film applicator (No. 548-YKG manufactured by YASUDA SEIKI SEISAKUSHO, LTD.) and dried by heating at 150° C. for 15 minutes to prepare a near infrared absorbing layer 107 having a thickness of 50 µm. Then, on the near infrared absorbing layer 107, a color filter layer 105 and a microlens 106 were formed in this order to prepare a solid-state imaging element. Separately from this, on a slide glass (manufactured by MUTO PURE CHEMICALS CO., LTD., material: soda glass) having a thickness of 1.3 mm, the same film as the above near infrared absorbing layer 107 was formed in the same manner, and the transmittance of the nIR absorbing film was measured employing a slide glass having a thickness of 1.3 mm as the base line. The results are shown in Table 3 and FIG. 27 (transmission spectrum).

Example 12 nIR absorbing particles (number average aggregated particle size: 65 nm) obtained by size classification from the above nIR absorbing particles and an epoxy resin (tradename: EX1011 manufactured by NAGASE & CO., LTD., refractive index: 1.62) were mixed in such a ratio that the solid content comprised 37 mass % of the nIR absorbing particles and 63 mass % of the epoxy resin, and zirconia beads having a diameter of 0.5 mm were added to the mixed liquid and pulverization was carried out by a ball mill to obtain a dispersion. The obtained dispersion was applied on the surface of a semiconductor substrate 103 having photoelectric conversion elements 101, a light shielding layer 102 and a planarizing layer 104 formed thereon as shown in FIG. 3, i.e. on the surface of the planarizing layer 104, by a spin coater (spin coater MS-A200) and heated at 100° C. for one hour and at 180° C. further for 4 hours to prepare a near infrared absorbing layer 107 having a thickness of 100 µm. Then, on the near infrared absorbing layer 107, a color filter layer 105 and a microlens 106 were formed in this order to prepare a solid-state imaging element. This solid-state imaging element corresponds to the solid-state imaging element according to the third embodiment of the present invention. Separately from this, on a glass plate (soda glass) having a thickness of 1.3 mm, the same film as the near infrared absorbing layer 107 was formed in the same manner, and the transmittance of the nIR absorbing film was measured employing a glass plate having a thickness of 1.3 mm as the base line. The results are shown in Table 3.

Production of Lens for Imaging Device

Figure 28:
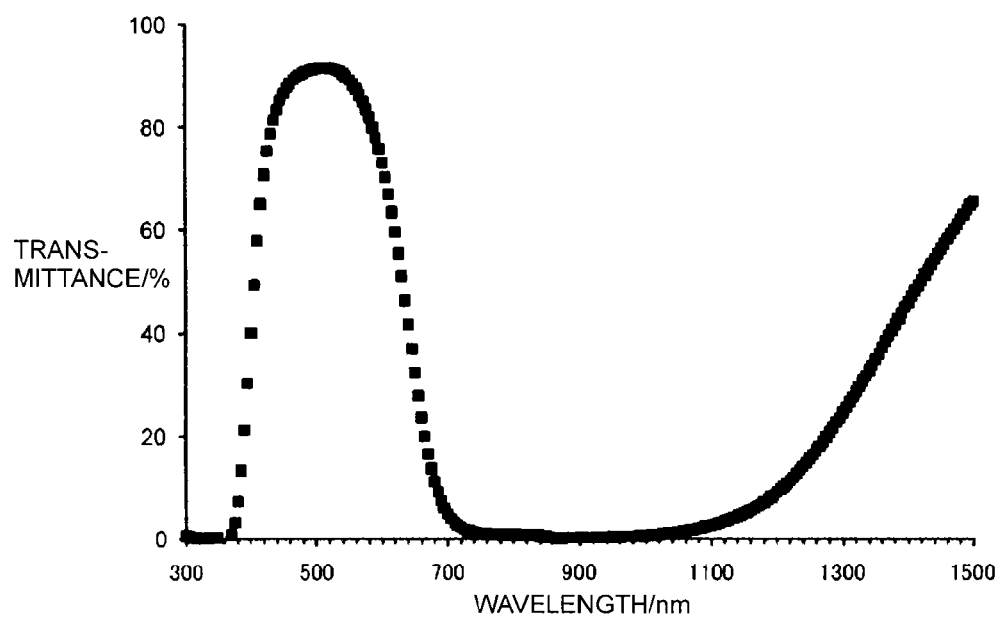
FIG. 28 illustrates a transmission spectrum of a lens for an imaging device according to an example of the present invention.

Example 13 nIR absorbing particles obtained by the above production process and a methacrylic resin (tradename: HV153 manufactured by ADELL Corporation, refractive index: 1.63) were mixed in such a ratio that the solid content comprised 37 mass % of the nIR absorbing particles and 63 mass % of the methacrylic resin, and zirconia beads having a diameter of 0.5 mm were added to the mixed liquid and pulverization was carried out by a ball mill to obtain a dispersion. The obtained dispersion was applied on one surface (planar surface) of a glass plano-convex lens by a spin coater (spin coater MS-A200 manufactured by Mikasa Co., Ltd.) and dried by heating at 120° C. for one minute to prepare a near infrared absorbing layer 71a having a thickness of 100 µm. This lens corresponds to the lens for an imaging device according to the fourth embodiment of the present invention. Separately from this, on a glass plate (soda glass) having a thickness of 1.3 mm, the same film as the near infrared absorbing layer 71a was formed in the same manner, and the transmittance of the nIR absorbing layer was measured employing a glass plate having a thickness of 1.3 mm as the base line. The results are shown in Table 4 and FIG. 28 (transmission spectrum).

Example 14

The above nIR absorbing particles and a 30 mass % cyclohexanone solution of a polyester resin (tradename: VYLON 103 manufactured by TOYOBO CO., LTD., refractive index: 1.60 to 1.61) were mixed in such a ratio that the solid content comprised 44 mass % of the nIR absorbing particles and 56 mass % of the polyester resin, and stirred by a rotational/orbital-motion mixer to obtain a dispersion. The obtained dispersion was applied on one surface (planar surface) of a glass plano-convex lens by a film applicator (No. 548-YKG manufactured by YASUDA SEIKI SEISAKUSHO, LTD.) and heated at 150° C. for 15 minutes to form a near infrared absorbing layer (VII) (hereinafter referred to as absorbing layer (VII)) having a thickness of 50 µm.

Further, ITO particles (manufactured by Fuji Titanium Industry Co., Ltd., size of crystallites: 38 nm) were mixed with ethanol together with a dispersing agent to obtain a dispersion having a solid content concentration of 20 wt %.

Figure 29:
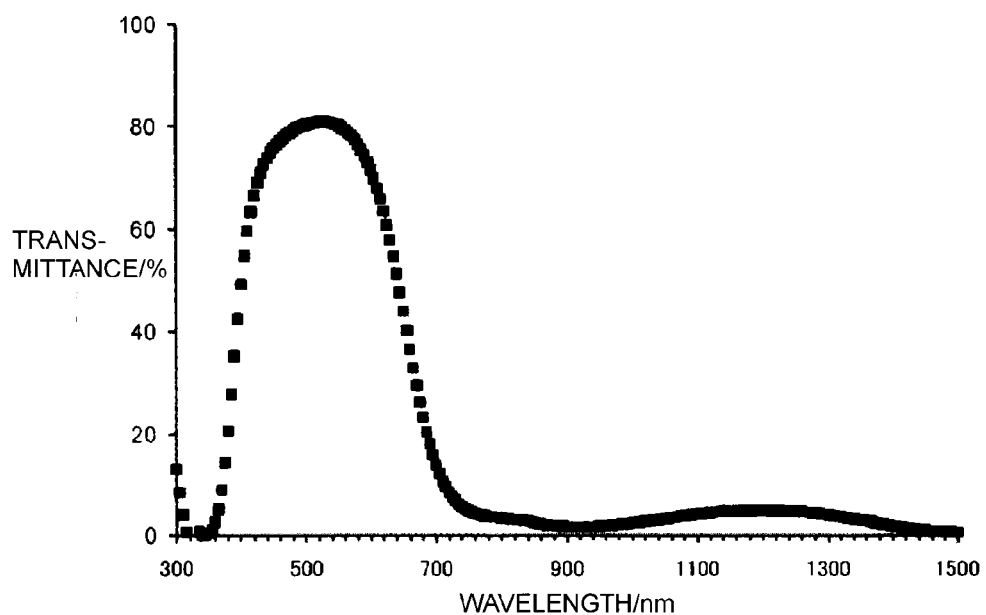
FIG. 29 illustrates a transmission spectrum of an absorbing film comprising two layers of an absorbing layer (VII) and an absorbing layer (VIII) of a lens for an imaging device according to an example of the present invention.

This ITO particle-containing dispersion was applied on the near infrared absorbing layer (VII) by a spin coater (spin coater MS-A200) and heated at 150° C. for 15 minutes to form a near infrared absorbing layer (hereinafter referred to as absorbing layer (VIII)) having a thickness of 4 µm thereby to prepare a near infrared absorbing layer 71a. This lens corresponds to the lens for an imaging device according to the fourth embodiment of the present invention. Separately from this, on a film formed in the same manner as the absorbing layer (VII) on a glass plate (float plate glass manufactured by Asahi Glass Company, Limited, type: clear FL3.5) having a thickness of 3.5 mm, the same film as the absorbing layer (VIII) was formed in the same manner, and the transmittance of the absorbing film having a two layer structure comprising the absorbing layer (VII) and the absorbing layer (VIII) was measured employing a glass plate having a thickness of 3.5 mm as the base line. The results are shown in Table 4 and FIG. 29 (transmission spectrum).

Figure 30:
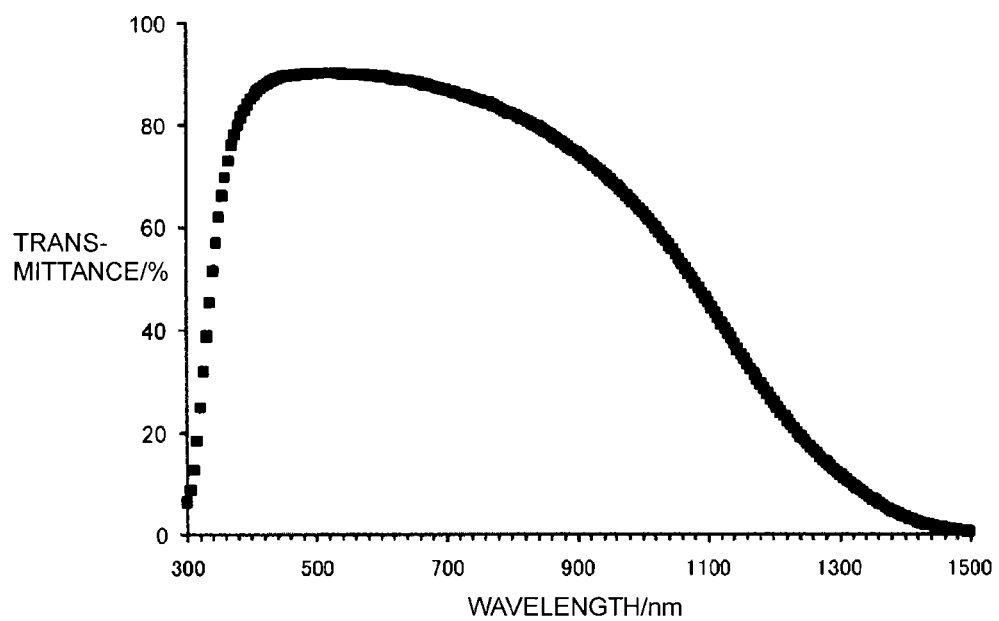
FIG. 30 illustrates a transmission spectrum of a lens for an imaging device according to another example of the present invention.

Further, separately from the preparation of the lens for an imaging device, the above ITO particle-containing dispersion was applied on a glass plate (float plate glass manufactured by Asahi Glass Company, Limited, type: clear FL3.5) having a thickness of 3.5 mm by a film applicator (No. 548-YKG manufactured by YASUDA SEIKI SEISAKUSHO, LTD.) and heated at 150° C. for 15 minutes to form a near infrared absorbing layer (absorbing layer (II)) having a thickness of 4 µm, and its transmittance was measured. The results obtained by subtracting the transmittances measured with respect to the glass plate having a thickness of 3.5 mm before the ITO particle-containing dispersion was applied, from the above measured transmittances, are shown in FIG. 30 (transmission spectrum).

Figure 31:
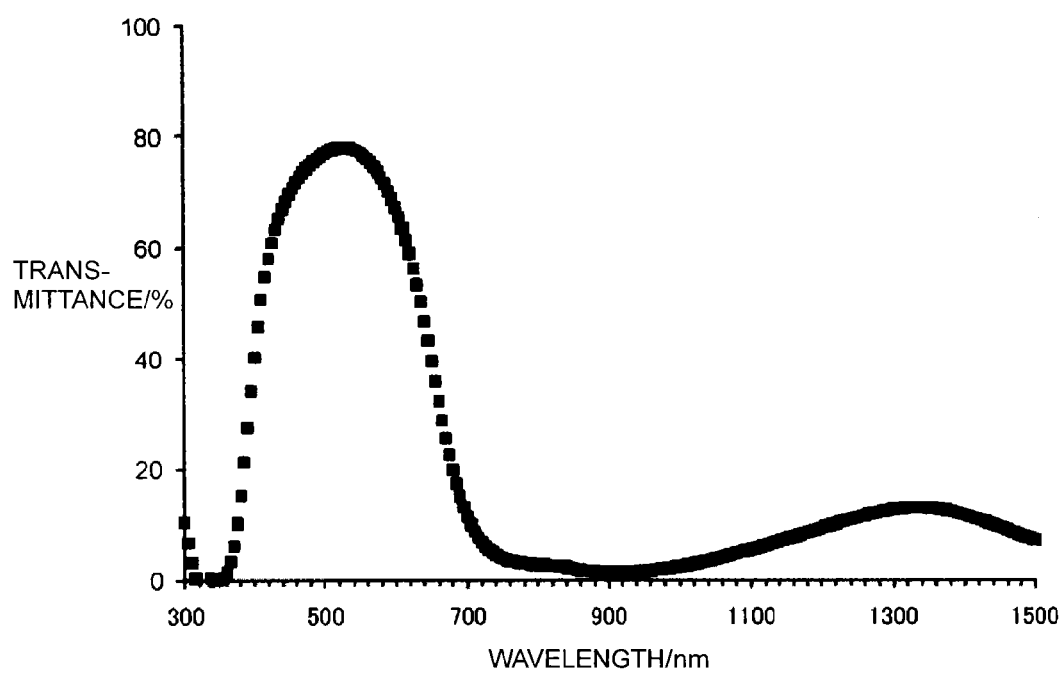
FIG. 31 illustrates a transmission spectrum of a lens for an imaging device according to another example of the present invention.

Example 15 nIR absorbing particles obtained by the above production process, ITO particles (manufactured by Fuji Titanium Industry Co., Ltd.) used in Example 14 and a 30 mass % cyclohexanone solution of a polyester resin (tradename: VYLON 103) were mixed in such a ratio that the solid content comprised 50 mass % of the nIR absorbing particles, 3 mass % of the ITO particles and 46 mass % of the polyester resin, and stirred by a rotational/orbital-motion mixer to obtain a dispersion. The obtained dispersion was applied on one surface (planar surface) of a glass plano-convex lens by a film applicator (No. 548-YKG manufactured by YASUDA SEIKI SEISAKUSHO, LTD.) and dried by heating at 150° C. for 15 minutes to prepare a near infrared absorbing layer 71a having a thickness of 50 µm. Separately from this, on a slide glass (manufactured by MUTO PURE CHEMICALS CO., LTD., material: soda glass) having a thickness of 1.3 mm, the same film as the near infrared absorbing layer 71a was formed in the same manner, and the transmittance of the nIR absorbing film was measured employing a slide glass having a thickness of 1.3 mm as the base line. The results are shown in Table 4 and FIG. 31 (transmission spectrum).

Example 16 nIR absorbing particles (number average aggregated particle size: 65 nm) obtained by size classification from the above nIR absorbing particles and an epoxy resin (tradename: EX1011 manufactured by NAGASE & CO., LTD., refractive index: 1.62) were mixed in such a state that the solid content comprised 37 mass % of the nIR absorbing particles and 63 mass % of the epoxy resin, and zirconia beads having a diameter of 0.5 mm were added to the mixed liquid and pulverization was carried out by a ball mill to obtain a dispersion. The obtained dispersion was applied on one surface (planar surface) of a glass plano-convex lens by a spin coater (spin coater MS-A200) and heated at 100° C. for one hour and at 180° C. further for 4 hours to prepare a near infrared absorbing film 71a having a thickness of 100 µm. This lens corresponds to a lens for an imaging device according to the fourth embodiment of the present invention. Separately from this, on a glass plate (soda glass) having a thickness of 1.3 mm, the same film as the near infrared absorbing film 71a was formed, and the transmittance of the nIR absorbing film was measured employing a glass plate having a thickness of 1.3 mm as the base line. The results are shown in Table 4.

TABLE 1

|  |  | Example 1 | Example 2 Absorbing layer (II) | Example 2 Absorbing layer (I) + (II) | Example 3 | Example 4 |
|---|---|---|---|---|---|---|
| nIR absorbing particles | Type | $KCuPO_4$ | ITO | $KCuPO_4$ + ITO | $KCuPO_4$ + ITO | $KCuPO_4$ |
|  | Size of crystallites (nm) | 27 | 38 | 27 ($KCuPO_4$) 38 (ITO) | 27 ($KCuPO_4$) 38 (ITO) | 27 |
|  | Number average aggregated particle size (nm) | 89 | — | 89 ($KCuPO_4$) | 89 ($KCuPO_4$) | 65 |
| Reflectance (%) | 600 nm | 65.6 | — | 65.6 ($KCuPO_4$) | 65.6 ($KCuPO_4$) | 65.6 |
|  | 700 nm | 19.9 | — | 19.9 ($KCuPO_4$) | 19.9 ($KCuPO_4$) | 19.9 |
|  | Change D in reflectance (%/nm) | −0.46 | — | −0.46 ($KCuPO_4$) | −0.46 ($KCuPO_4$) | −0.46 |
| Transmittance (%) | 500 nm | 91.5 | 90.4 | 80.4 | 76.9 | 87.0 |
|  | 630 nm | 51.0 | 89.0 | 58.0 | 53.4 | 45.2 |
|  | 700 nm | 4.8 | 87.1 | 13.9 | 11.5 | 13.0 |
|  | 715 nm | 2.6 | 86.5 | 9.6 | 7.7 | 2.0 |
|  | 900 nm | 0.2 | 74.7 | 1.8 | 1.5 | 0.2 |
|  | 1,100 nm | 2.6 | 45.5 | 4.2 | 5.5 | 1.5 |
|  | Change D' in transmittance (%/nm) | −0.66 | −0.03 | −0.63 | −0.60 | −0.46 |
|  | Thickness (μm) | 100 | 4 | 54 | 50 | 100 |

TABLE 2

|  |  | Example 5 | Example 6 Absorbing layer (III) | Example 6 Absorbing layer (III) + (IV) | Example 7 | Example 8 |
|---|---|---|---|---|---|---|
| nIR absorbing particles | Type | $KCuPO_4$ | ITO | $KCuPO_4$ + ITO | $KCuPO_4$ + ITO | $KCuPO_4$ |
|  | Size of crystallites (nm) | 27 | 38 | 27 ($KCuPO_4$) 38 (ITO) | 27 ($KCuPO_4$) 38 (ITO) | 27 |
|  | Number average aggregated particle size (nm) | 89 | — | 89 ($KCuPO_4$) | 89 ($KCuPO_4$) | 65 |
| Reflectance (%) | 600 nm | 65.6 | — | 65.6 ($KCuPO_4$) | 65.6 ($KCuPO_4$) | 65.6 |
|  | 700 nm | 19.9 | — | 19.9 ($KCuPO_4$) | 19.9 ($KCuPO_4$) | 19.9 |
|  | Change D in reflectance (%/nm) | −0.46 | — | −0.46 ($KCuPO_4$) | −0.46 ($KCuPO_4$) | −0.46 |
| Transmittance (%) | 500 nm | 91.5 | 90.4 | 80.4 | 76.9 | 87.0 |
|  | 630 nm | 51.0 | 89.0 | 58.0 | 53.4 | 45.2 |
|  | 700 nm | 4.8 | 87.1 | 13.9 | 11.5 | 13.0 |
|  | 715 nm | 2.6 | 86.5 | 9.6 | 7.7 | 2.0 |
|  | 900 nm | 0.2 | 74.7 | 1.8 | 1.5 | 0.2 |
|  | 1,100 nm | 2.6 | 45.5 | 4.2 | 5.5 | 1.5 |
|  | Change D' in transmittance (%/nm) | −0.66 | −0.03 | −0.63 | −0.60 | −0.46 |
|  | Thickness (μm) | 100 | 4 | 54 | 50 | 100 |

TABLE 3

|  |  | Example 9 | Example 10 Absorbing layer (V) | Example 10 Absorbing layer (V) + (VI) | Example 11 | Example 12 |
|---|---|---|---|---|---|---|
| nIR absorbing particles | Type | $KCuPO_4$ | ITO | $KCuPO_4$ + ITO | $KCuPO_4$ + ITO | $KCuPO_4$ |
|  | Size of crystallites (nm) | 27 | 38 | 27 ($KCuPO_4$) 38 (ITO) | 27 ($KCuPO_4$) 38 (ITO) | 27 |
|  | Number average aggregated particle size (nm) | 89 | — | 89 ($KCuPO_4$) | 89 ($KCuPO_4$) | 65 |
| Reflectance (%) | 600 nm | 65.6 | — | 65.6 ($KCuPO_4$) | 65.6 ($KCuPO_4$) | 65.6 |
|  | 700 nm | 19.9 | — | 19.9 ($KCuPO_4$) | 19.9 ($KCuPO_4$) | 19.9 |
|  | Change D in reflectance (%/nm) | −0.46 | — | −0.46 ($KCuPO_4$) | −0.46 ($KCuPO_4$) | −0.46 |
| Transmittance (%) | 500 nm | 91.5 | 90.4 | 80.4 | 76.9 | 87.0 |
|  | 630 nm | 51.0 | 89.0 | 58.0 | 53.4 | 45.2 |
|  | 700 nm | 4.8 | 87.1 | 13.9 | 11.5 | 13.0 |
|  | 715 nm | 2.6 | 86.5 | 9.6 | 7.7 | 2.0 |
|  | 900 nm | 0.2 | 74.7 | 1.8 | 1.5 | 0.2 |
|  | 1,100 nm | 2.6 | 45.5 | 4.2 | 5.5 | 1.5 |
|  | Change D' in transmittance (%/nm) | −0.66 | −0.03 | −0.63 | −0.60 | −0.46 |
|  | Thickness (μm) | 100 | 4 | 54 | 50 | 100 |

TABLE 4

| | | Example 13 | Example 14 Absorbing layer (VII) | Example 14 Absorbing layer (VII) + (VIII) | Example 15 | Example 16 |
|---|---|---|---|---|---|---|
| nIR absorbing particles | Type | KCuPO$_4$ | ITO | KCuPO$_4$ + ITO | KCuPO$_4$ + ITO | KCuPO$_4$ |
| | Size of crystallites (nm) | 27 | 38 | 27 (KCuPO$_4$) 38 (ITO) | 27 (KCuPO$_4$) 38 (ITO) | 27 |
| | Number average aggregated particle size (nm) | 89 | — | 89 (KCuPO$_4$) | 89 (KCuPO$_4$) | 65 |
| Reflectance (%) | 600 nm | 65.6 | — | 65.6 (KCuPO$_4$) | 65.6 (KCuPO$_4$) | 65.6 |
| | 700 nm | 19.9 | — | 19.9 (KCuPO$_4$) | 19.9 (KCuPO$_4$) | 19.9 |
| Change D in reflectance (%/nm) | | −0.46 | — | −0.46 (KCuPO$_4$) | −0.46 (KCuPO$_4$) | −0.46 |
| Transmittance (%) | 500 nm | 91.5 | 90.4 | 80.4 | 76.9 | 87.0 |
| | 630 nm | 51.0 | 89.0 | 58.0 | 53.4 | 45.2 |
| | 700 nm | 4.8 | 87.1 | 13.9 | 11.5 | 13.0 |
| | 715 nm | 2.6 | 86.5 | 9.6 | 7.7 | 2.0 |
| | 900 nm | 0.2 | 74.7 | 1.8 | 1.5 | 0.2 |
| | 1,100 nm | 2.6 | 45.5 | 4.2 | 5.5 | 1.5 |
| Change D' in transmittance (%/nm) | | −0.66 | −0.03 | −0.63 | −0.60 | −0.46 |
| Thickness (μm) | | 100 | 4 | 54 | 50 | 100 |

The present invention is by no means restricted to the above-described embodiments and Examples, and it is obvious that various changes and modifications are possible without departing from the intention and the scope of the present invention.

INDUSTRIAL APPLICABILITY

The optical member and the near infrared cut filter of the present invention have good near infrared shielding properties and can achieve sufficient downsizing and reduction in thickness, and accordingly they are useful for e.g. an imaging device such as a digital still camera, a display device such as a plasma display, a glass window for a vehicle (e.g. an automobile), a lamp, etc. The solid-state imaging element of the present invention can have both good near infrared shielding function and function as a solid-state imaging element, and accordingly it is useful for an imaging device such as a miniature camera installed in information equipment of e.g. a digital still camera, a digital video camera, a portable phone, a notebook personal computer or a PDA. The lens for an imaging device of the present invention has good near infrared shielding function and can achieve sufficient downsizing, reduction in thickness and reduction in the cost of an imaging device, and accordingly it is useful for an imaging device employing a solid-state imaging element, such as a miniature camera installed in information equipment of e.g. a digital still camera, a digital video camera, a portable phone, a notebook personal computer or a PDA.

This application is a continuation of PCT Application No. PCT/JP2010/071937, filed on Dec. 7, 2010, which is based upon and claims the benefit of priorities from Japanese Patent Application No. 2009-277242 filed on Dec. 7, 2009, Japanese Patent Application No. 2009-290392 filed on Dec. 22, 2009, Japanese Patent Application No. 2010-006893 filed on Jan. 15, 2010 and Japanese Patent Application No. 2010-020235 filed on Feb. 1, 2010. The contents of those applications are incorporated herein by reference in their entirety.

REFERENCE SYMBOLS

10: near infrared cut filter, 12: transparent substrate, 14, 72, 107: near infrared absorbing layer, 20A, 20B, 20C, 92: solid-state imaging element, 30, 90A, 90B: imaging device, 70A, 70B, 70C, 70D, 80A, 80B, 80C: lens for an imaging device, 71: lens main body, 102: light shielding layer, 101: photoelectric conversion element, 103: semiconductor substrate, 104: pulverizing layer, 105: color filter layer, 106: micro-lens, L1 to L4: first to fourth lenses.

What is claimed is:

1. An optical member comprising near infrared absorbing particles which are aggregated particles of crystallites of an oxide,
wherein a number average particle size of the aggregated particles is at least 20 nm and at most 200 nm,
wherein the oxide is at least one compound represented by formula (1):

$$A_{1/n}CuPO_4 \qquad (1)$$

where A is an alkaline metal (Li, Na, K, Rb or Cs), an alkaline earth metal (Mg, Ca, Sr or Ba), or NH$_4$, and n is 1 when A is the alkali metal or NH$_4$ and is 2 when A is the alkaline earth metal, and
wherein the optical member is in a form of a film or a thin plate.

2. The optical member according to claim 1, wherein the size of the crystallites of the oxide is at least 5 nm and at most 80 nm, as determined by X-ray diffraction.

3. The optical member according to claim 1, wherein the near infrared absorbing particles have a change D in the reflectance represented by formula (2) of at most −0.41:

$$D(\%/nm)=[R_{700}(\%)-R_{600}(\%)]/[700 \text{ (nm)}-600 \text{ (nm)}] \qquad (2)$$

wherein R$_{700}$ is a reflectance at a wavelength of 700 nm of the near infrared absorbing particles in a diffuse reflectance spectrum, and R$_{600}$ is a reflectance at a wavelength of 600 nm of the near infrared absorbing particles in a diffuse reflectance spectrum.

4. The optical member according to claim 1, wherein the near infrared absorbing particles have a reflectance at a wavelength of 715 nm of at most 19% and a reflectance at a wavelength of 500 nm of at least 85% in a diffuse reflectance spectrum.

5. The optical member according to claim 1, wherein the content of the near infrared absorbing particles is at least 20 mass % and at most 60 mass % with respect to the mass of the optical member.

6. The optical member according to claim 1, wherein the optical member further comprises second near infrared absorbing particles other than the near infrared absorbing particles which are the aggregated particles of the crystallites of the oxide represented by formula (1).

7. The optical member according to claim 6, wherein the content of the second near infrared absorbing particles is at least 0.5 mass % and at most 30 mass % with respect to the mass of the optical member.

8. The optical member according to claim 6, wherein the second near infrared absorbing particles comprise indium-doped tin oxide particles.

9. The optical member according to claim 1, wherein the optical member further comprises a transparent resin.

10. The optical member according to claim 9, wherein the content of the transparent resin is at least 40 mass % and at most 80 mass % with respect to the mass of the optical member.

11. The optical member according to claim 1, wherein the change D' in the transmittance represented by formula (3) is at most −0.36:

$$D'(\%/nm)=[T_{700}(\%)-T_{630}(\%)]/[700 \text{ (nm)}-630 \text{ (nm)}] \quad (3)$$

wherein $T_{700}$ is a transmittance at a wavelength of 700 nm of the optical member in a transmission spectrum, and $T_{630}$ is a transmittance at a wavelength of 630 nm of the optical member in a transmission spectrum.

12. The optical member according to claim 1, wherein the oxide is a compound represented by formula (1):

$$Au_{1/n}CuPO_4 \quad (1)$$

wherein A is one member selected from the group consisting of alkaline metals (Li, Na, K, Rb and Cs), alkaline earth metals (Mg, Ca, Sr and Ba) and $NH_4$, and n is 1 when A is an alkali metal or $NH_4$ and is 2 when A is an alkaline earth metal.

13. An optical member comprising near infrared absorbing particles which are aggregated particles of crystallites of an oxide, the oxide comprising Cu and P,
wherein a number average particle size of the aggregated particles is at least 20 nm and at most 200 nm,
wherein the optical member is in a form of a film or a thin plate,
wherein the near infrared absorbing particles comprise a phosphate group,
wherein a micro-IR spectrum of the near infrared absorbing particles has a first absorption peak attributable to water attached to the near infrared absorbing particles in the vicinity of 1,600 cm$^{-1}$, and a second absorption peak attributable to a hydroxyl group attached to the near infrared absorbing particles in the vicinity of 3,750 cm$^{-1}$, and a third absorption peak attributable to the phosphate group in the vicinity of 1,000 cm$^{-1}$, and
wherein an intensity of the first peak is at most 8% of an intensity of the third peak, and an intensity of the second peak is at most 26% of the intensity of the third peak.

14. The optical member according to claim 13,
wherein the oxide is at least one compound represented by formula (1):

$$Au_{1/n}CuPO_4 \quad (1)$$

where A is an alkaline metal (Li, Na, K, Rb or Cs), an alkaline earth metal (Mg, Ca, Sr or Ba), or $NH_4$, and n is 1 when A is the alkali metal or $NH_4$ and is 2 when A is the alkaline earth metal.

15. The optical member according to claim 13,
wherein the oxide is a compound represented by formula (1):

$$Au_{1/n}CuPO_4 \quad (1)$$

wherein A is one member selected from the group consisting of alkaline metals (Li, Na, K, Rb and Cs), alkaline earth metals (Mg, Ca, Sr and Ba) and $NH_4$, and n is 1 when A is an alkali metal or $NH_4$ and is 2 when A is an alkaline earth metal.

16. The optical member according to claim 13, wherein the size of the crystallites of the oxide is at least 5 nm and at most 80 nm, as determined by X-ray diffraction.

17. The optical member according to claim 13, wherein the near infrared absorbing particles have a change D in the reflectance represented by formula (2) of at most −0.14:

$$D(\%/nm)=[R_{700}(\%)-R_{600}(\%)]/[700 \text{ (nm)}-600 \text{ (nm)}] \quad (2)$$

wherein $R_{700}$ is a reflectance at a wavelength of 700 nm of the near infrared absorbing particles in a diffuse reflectance spectrum, and $R_{600}$ is a reflectance at a wavelength of 600 nm of the near infrared absorbing particles in a diffuse reflectance spectrum.

18. The optical member according to claim 13, wherein the near infrared absorbing particles have a reflectance at a wavelength of 715 nm of at most 19% and a reflectance at a wavelength of 500 nm of at least 85% in a diffuse reflectance spectrum.

19. A near infrared cut filter, comprising:
a transparent substrate; and
a near infrared absorbing layer formed on at least one side of the transparent substrate, the near infrared absorbing layer comprising near infrared absorbing particles which are aggregated particles of crystallites of an oxide,
wherein a number average particle size of the aggregated particles is at least 20 nm and at most 200 nm, and
wherein the oxide is at least one compound represented by formula (1):

$$Au_{1/n}CuPO_4 \quad (1)$$

where A is an alkaline metal (Li, Na, K, Rb or Cs), an alkaline earth metal (Mg, Ca, Sr or Ba), or $NH_4$, and n is 1 when A is the alkali metal or $NH_4$ and is 2 when A is the alkaline earth metal.

20. The near infrared cut filter according to claim 19, wherein the transparent substrate is made of at least one member selected from the group consisting of glass, polyethylene terephthalate, an acrylic resin, a urethane resin, a polycarbonate resin, polyethylene, an ethylene/vinyl acetate copolymer, a vinyl chloride resin and a fluororesin.

21. A solid-state imaging element comprising:
photoelectric conversion elements; and
a near infrared absorbing layer formed on the photoelectric conversion elements, the near infrared absorbing layer comprising near infrared absorbing particles which are aggregated particles of crystallites of an oxide,
wherein a number average particle size of the aggregated particles is at least 20 nm and at most 200 nm, and
wherein the oxide is at least one compound represented by formula (1):

$$Au_{1/n}CuPO_4 \quad (1)$$

where A is an alkaline metal (Li, Na, K, Rb or Cs), an alkaline earth metal (Mg, Ca, Sr or Ba), or $NH_4$, and n is 1 when A is the alkali metal or $NH_4$ and is 2 when A is the alkaline earth metal.

22. The solid-state imaging element according to claim 21, further comprising at least one member selected from a light shielding layer, a planarizing layer, a color filter layer and a microlens, on the photoelectric conversion elements.

23. The solid-state imaging element according to claim 21, further comprising at least one member selected from a light shielding layer, a planarizing layer, a color filter layer and a microlens, on the photoelectric conversion elements, at least a part of the member being constituted by the near infrared absorbing layer.

24. An imaging device comprising the solid-state imaging element as defined in claim 21.

25. A lens for an imaging device, comprising a near infrared absorbing layer which comprises near infrared absorbing particles which are aggregated particles of crystallites of an oxide,
   wherein a number average particle size of the aggregated particles is at least 20 nm and at most 200 nm, and
   wherein the oxide is at least one compound represented by formula (1):

$$Au_{1/n}CuPO_4 \tag{1}$$

where A is an alkaline metal (Li, Na, K, Rb or Cs), an alkaline earth metal (Mg, Ca, Sr or Ba), or $NH_4$, and n is 1 when A is the alkali metal or $NH_4$ and is 2 when A is the alkaline earth metal.

26. The lens for an imaging device according to claim 25, wherein the near infrared absorbing layer is a layer formed on at least one side of a main body of the lens.

27. An imaging device comprising the lens as defined in claim 25.

28. An imaging/display device, comprising a near infrared absorbing layer comprising near infrared absorbing particles which are aggregated particles of crystallites of an oxide,
   wherein a number average aggregated particle size of the aggregated particles is at least 20 nm and at most 200 nm, and
   wherein the oxide is at least one compound represented by formula (1):

$$A_{1/n}CuPO_4 \tag{1}$$

where A is an alkaline metal (Li, Na, K, Rb or Cs), an alkaline earth metal (Mg, Ca, Sr or Ba), or $NH_4$, and n is 1 when A is the alkali metal or $NH_4$ and is 2 when A is the alkaline earth metal.

* * * * *